United States Patent
Ueno et al.

(10) Patent No.: US 12,368,466 B2
(45) Date of Patent: Jul. 22, 2025

(54) RADIO-FREQUENCY MODULE AND COMMUNICATION APPARATUS

(71) Applicant: Murata Manufacturing Co., Ltd., Kyoto (JP)

(72) Inventors: Kouichi Ueno, Kyoto (JP); Hisanori Murase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 407 days.

(21) Appl. No.: 17/805,235

(22) Filed: Jun. 3, 2022

(65) Prior Publication Data

US 2022/0294487 A1 Sep. 15, 2022

Related U.S. Application Data

(63) Continuation of application No. PCT/JP2020/028524, filed on Jul. 22, 2020.

(30) Foreign Application Priority Data

Dec. 27, 2019 (JP) .................................. 2019-239496
Apr. 24, 2020 (JP) .................................. 2020-077817

(51) Int. Cl.
  *H04B 1/40* (2015.01)
  *H03H 9/00* (2006.01)
  (Continued)

(52) U.S. Cl.
  CPC ............. *H04B 1/40* (2013.01); *H03H 9/0009* (2013.01); *H03H 9/0576* (2013.01); *H03H 9/725* (2013.01)

(58) Field of Classification Search
  CPC ........ H04B 1/40; H04B 1/006; H04B 1/0057; H04B 1/005; H03H 9/0009; H03H 9/725; H03H 9/0576
  See application file for complete search history.

(56) References Cited

U.S. PATENT DOCUMENTS 9,960,747 B2 * 5/2018 Whitefield ........... H04B 1/0458
2013/0178180 A1 7/2013 Oshima et al.
(Continued)

FOREIGN PATENT DOCUMENTS

CN 109286384 A 1/2019
JP 2013-98785 A 5/2013
(Continued)

OTHER PUBLICATIONS

CN109274477A, Yang, Asignal processing method and device and computer storage medium, Jan. 2019, pp. 1-6 (Year: 2019).*

(Continued)

*Primary Examiner* — Keith Ferguson
(74) *Attorney, Agent, or Firm* — McDonald Hopkins LLC

(57) ABSTRACT

To provide a radio-frequency module and a communication apparatus capable of achieving more excellent impedance characteristics. A radio-frequency module includes a first acoustic-wave filter (a first reception filter), a second acoustic-wave filter (a second reception filter), a switch (an antenna switch), a first inductor, and a second inductor. The first acoustic-wave filter transmits a signal in a first communication band. The second acoustic-wave filter transmits a signal in a second communication band. The first inductor is provided between ground and a node on a signal path (a second reception path) with which the switch is connected to the second acoustic-wave filter. The second inductor is connected in series between the switch and the first inductor on the signal path.

19 Claims, 14 Drawing Sheets

(51) Int. Cl.
*H03H 9/05* (2006.01)
*H03H 9/72* (2006.01)

(56) References Cited

U.S. PATENT DOCUMENTS

| | | |
|---|---|---|
| 2013/0273861 A1 | 10/2013 | See |
| 2013/0309984 A1* | 11/2013 | Uejima ................. H04B 1/525 |
| | | 455/114.1 |
| 2017/0301561 A1* | 10/2017 | Kogure ................. H04B 1/006 |
| 2018/0227006 A1* | 8/2018 | Yasuda ................... H04B 1/18 |
| 2019/0028086 A1 | 1/2019 | Takamine |
| 2020/0186126 A1 | 6/2020 | Miyazaki |
| 2020/0228074 A1 | 7/2020 | Naniwa et al. |
| 2020/0403596 A1 | 12/2020 | Yamaguchi et al. |

FOREIGN PATENT DOCUMENTS

| | | | |
|---|---|---|---|
| JP | 2013-106128 A | 5/2013 | |
| JP | 2015-514381 A | 5/2015 | |
| WO | 2019/044034 A1 | 3/2019 | |
| WO | 2019/065569 A1 | 4/2019 | |
| WO | WO-2019188875 A1 * | 10/2019 | ............... H03H 7/46 |

OTHER PUBLICATIONS

International Search Report for International Patent Application No. PCT/JP2020/028524 dated Oct. 6, 2020.

* cited by examiner

Band 41

Band 3

Band 41

Band 3

Band 41

Band 3

Band 41

Band 3

Band 41

Band 3

Band 41

Band 3

Band 41

Band 41

Band 3

RADIO-FREQUENCY MODULE AND COMMUNICATION APPARATUS

CROSS REFERENCE TO RELATED APPLICATION

This is a continuation of International Application No. PCT/JP2020/028524 filed on Jul. 22, 2020 which claims priority from Japanese Patent Application No. 2019-239496 filed on Dec. 27, 2019 and Japanese Patent Application No. 2020-077817 filed on Apr. 24, 2020. The contents of these applications are incorporated herein by reference in their entireties.

BACKGROUND ART

Technical Field

The present disclosure generally relates to radio-frequency modules and communication apparatuses. More particularly, the present disclosure relates to a radio-frequency module and a communication apparatus that support simultaneous use of multiple different communications.

Background Art

A radio-frequency circuit (radio-frequency module) that transmits multiple radio-frequency signals having different frequency bands has hitherto been known (refer to Patent Document 1).

The radio-frequency circuit described in Patent Document 1 includes a first switch unit, a first matching circuit unit, and multiple filters composing a filter unit. In the first switch unit, an input terminal (an antenna terminal) is connected to an antenna element. An output terminal of the first switch unit is connected to an input terminal of the filter unit via the first matching circuit unit. The first matching circuit unit includes multiple inductors. One end of each of the multiple inductors is connected to the corresponding path, among multiple paths with which the first switch unit is connected to the multiple filters, and the other end thereof is grounded.

Patent Document 1: International Publication No. 2019/065569

BRIEF SUMMARY

In the radio-frequency circuit (the radio-frequency module) described in Patent Document 1, more excellent impedance characteristics are required even if the multiple filters (acoustic-wave filters) are simultaneously connected to the antenna terminal.

The present disclosure provides a radio-frequency module and a communication apparatus that are capable of achieving more excellent impedance characteristics.

A radio-frequency module according to one aspect of the present disclosure includes a first acoustic-wave filter, a second acoustic-wave filter, a switch, a first inductor, and a second inductor. The first acoustic-wave filter transmits a signal in a first communication band. The second acoustic-wave filter transmits a signal in a second communication band. The switch is capable of simultaneously connecting the first acoustic-wave filter and the second acoustic-wave filter to an antenna terminal. The first inductor is provided between ground and a node on a signal path with which the switch is connected to the second acoustic-wave filter. The second inductor is connected in series between the switch and the first inductor on the signal path.

A radio-frequency module according to one aspect of the present disclosure includes a first acoustic-wave filter, a second acoustic-wave filter, a switch, and a phase adjustment circuit. The first acoustic-wave filter transmits a signal in a first communication band. The second acoustic-wave filter transmits a signal in a second communication band, which is a frequency band lower than a frequency band of the first communication band. The switch is capable of simultaneously connecting the first acoustic-wave filter and the second acoustic-wave filter to an antenna terminal. The phase adjustment circuit is provided on a signal path with which the switch is connected to the second acoustic-wave filter and adjusts a phase of the signal in the second communication band. The phase adjustment circuit includes an inductor, a first capacitor, a second capacitor. The inductor is connected in series between the switch and the second acoustic-wave filter on the signal path. The first capacitor is provided between a first end at the switch side, among both ends of the inductor, and ground on the signal path. The second capacitor is provided between a second end at the second acoustic-wave filter side, among both ends of the inductor, and the ground on the signal path. A length of a first path between a node between the inductor and the second capacitor and the second acoustic-wave filter on the signal path is longer than a length of a second path between a node between the inductor and the first capacitor and the switch on the signal path.

A communication apparatus according to one aspect of the present disclosure includes the radio-frequency module and a signal processing circuit. The signal processing circuit performs signal processing of the signal in the first communication band and the signal in the second communication band.

According to the present disclosure, it is possible to achieve more excellent impedance characteristics.

DETAILED DESCRIPTION

Figure 1:
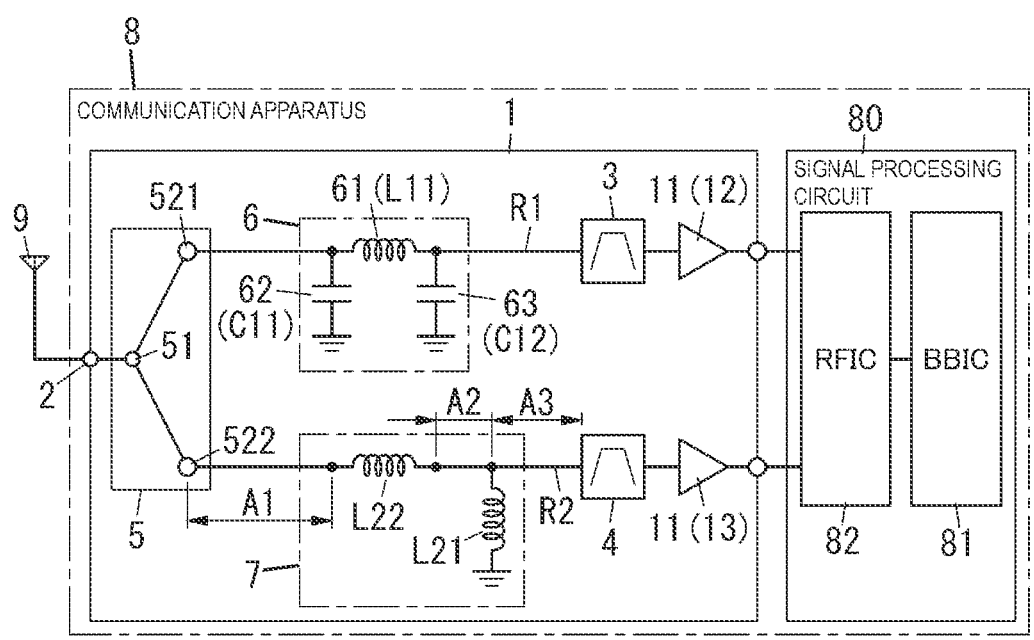
FIG. 1 is a schematic configuration diagram of a radio-frequency module according to a first embodiment and a communication apparatus including the radio-frequency module.

Radio-frequency modules and a communication apparatus according to embodiments will herein be described with reference to the drawings. The drawings referred to in the following embodiments and so on are schematic diagrams and the ratios of the sizes and the thicknesses of the respective components in the drawings do not necessarily reflect the actual dimensional ratios.

First Embodiment

A radio-frequency module 1 and a communication apparatus 8 according to a first embodiment will be described with reference to FIG. 1 to FIG. 6D.

(1) Radio-Frequency Module

The entire configuration of the radio-frequency module 1 according to the first embodiment will now be described with reference to FIG. 1.

Figure 2A:
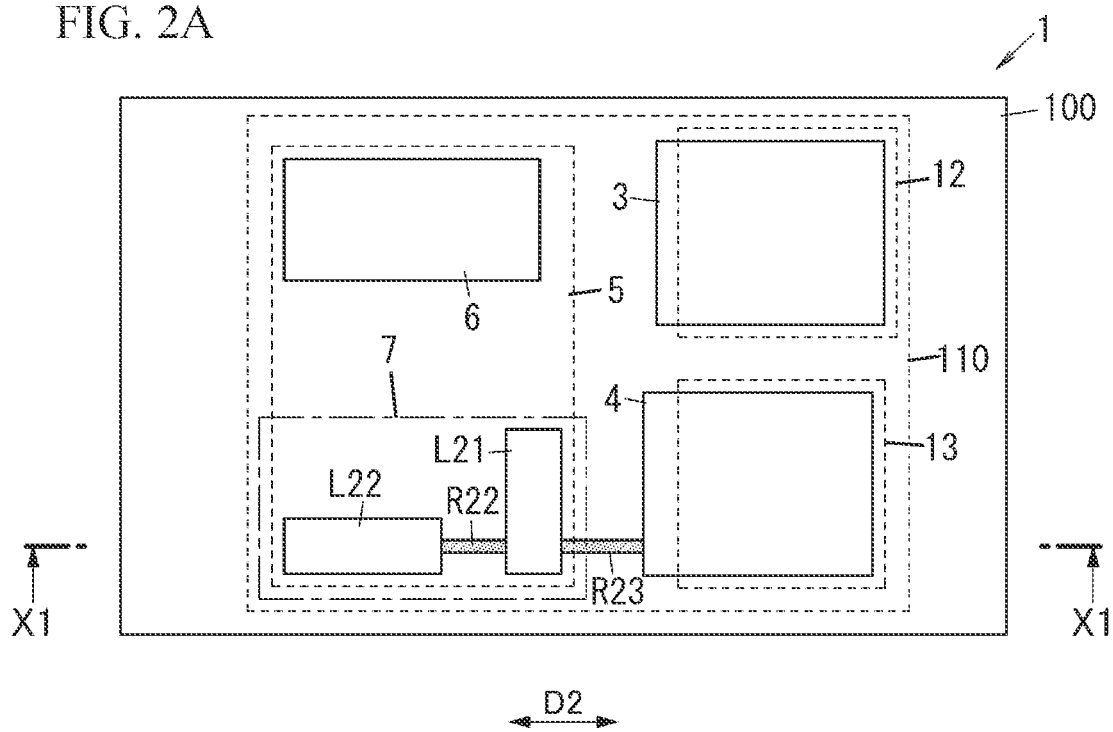
FIG. 2A is a plan view of the radio-frequency module in FIG. 1
Figure 2B:
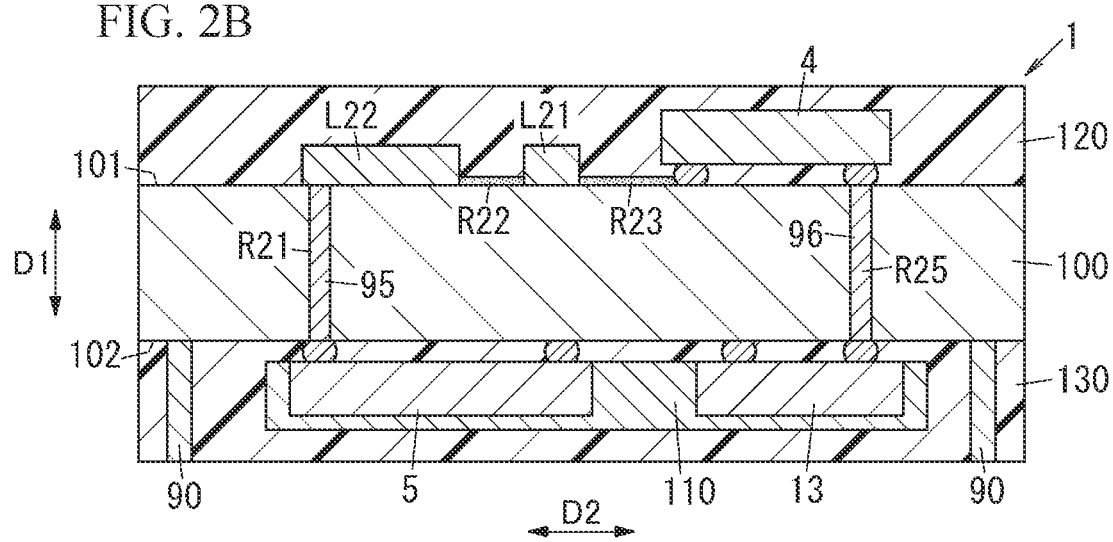
FIG. 2B is a cross-sectional view of the radio-frequency module in FIG. 1 taken along an X1-X1 line.

The radio-frequency module 1 according to the first embodiment includes an antenna terminal 2, a first reception filter 3, a second reception filter 4, an antenna switch 5 (switch), a first phase adjustment circuit 6, and a second phase adjustment circuit 7, as illustrated in FIG. 1. The radio-frequency module 1 also includes a first low noise amplifier 12 and a second low noise amplifier 13, which serve as amplifiers 11 that amplify signals. The radio-frequency module 1 further includes a mounting substrate 100, as illustrated in FIG. 2A and FIG. 2B.

The radio-frequency module 1 is used in, for example, a mobile phone such as a smart phone. The radio-frequency module 1 is not limitedly used in the mobile phone and may be used in, for example, a wearable terminal such as a smart watch. Specifically, the radio-frequency module 1 is used in the communication apparatus 8 that communicates with an external apparatus (not illustrated), as illustrated in FIG. 1. The radio-frequency module 1 is, for example, a module that supports fourth generation mobile communication (4G) standards, fifth generation mobile communication (5G) standards, and so on. The 4G standards are, for example, third generation partnership project (3GPP) long term evolution (LTE) standards. The 5G standards are, for example, fifth generation New Radio (5G NR). The radio-frequency module 1 is a module that supports carrier aggregation and dual connectivity.

(2) Components in Radio-Frequency Module

The respective components in the radio-frequency module 1 according to the first embodiment will now be described with reference to the drawings.

(2.1) Antenna Terminal

The antenna terminal 2 is electrically connected to an antenna 9, as illustrated in FIG. 1.

(2.2) First Reception Filter

The first reception filter 3 is an acoustic-wave filter. The acoustic-wave filter is, for example, a surface acoustic wave (SAW) filter using surface acoustic waves.

The first reception filter 3 is provided on a first reception path R1 used for receiving a first reception signal from the antenna 9, as illustrated in FIG. 1. In other words, the first reception path R1 is a signal path with which the antenna switch 5 is connected to the first reception filter 3 and is a path used for receiving the first reception signal through the antenna terminal 2.

The first reception filter 3 is an acoustic-wave filter using a first communication band as a passband. In other words, the first reception filter 3 is an acoustic-wave filter that transmits a signal in the first communication band. Specifically, the first reception filter 3 transmits the first reception signal in a first frequency band included in the first communication band. Here, the first communication band is, for example, Band3 (reception band: 1,805 MHz to 1,880 MHz) in the long term evolution (LTE) standards (including LTE-Advanced standards).

(2.3) Second Reception Filter

The second reception filter 4 is an acoustic-wave filter. The acoustic-wave filter is, for example, a SAW filter using the surface acoustic waves.

The second reception filter 4 is provided on a second reception path R2 used for receiving a second reception signal from the antenna 9, as illustrated in FIG. 1. In other words, the second reception path R2 is a signal path with which the antenna switch 5 is connected to the second reception filter 4 and is a path used for receiving the second reception signal through the antenna terminal 2.

The second reception filter 4 is an acoustic-wave filter using a second communication band as the passband. In other words, the second reception filter 4 is an acoustic-wave filter that transmits a signal in the second communication band. Specifically, the second reception filter 4 transmits the second reception signal in a second frequency band included in the second communication band. Here, the second frequency band is a frequency band higher than the first frequency band. Here, the second communication band is, for example, Band41 (reception band: 2,496 MHz to 2,690 MHz) in the long term evolution (LTE) standards (including the LTE-Advanced standards).

(2.4) Antenna Switch

The antenna switch 5 includes a common terminal 51 and multiple (two in the example in FIG. 1) selection terminals 521 to 522, as illustrated in FIG. 1. The antenna switch 5 selects at least one of the multiple selection terminals 521 to 522 as a terminal to which the common terminal 51 is connected. In other words, the antenna switch 5 selectively connects the first reception filter 3 and the second reception filter 4 to the antenna 9. The antenna switch 5 is configured to be capable of simultaneously connecting the first reception filter 3 and the second reception filter 4 to the common terminal 51.

The common terminal 51 is connected to the antenna terminal 2. Specifically, the common terminal 51 is electrically connected to the antenna 9 via the antenna terminal 2. The common terminal 51 is not limited to direct connection to the antenna 9. A filter, a coupler, or the like may be provided between the common terminal 51 and the antenna 9.

The selection terminal 521 is electrically connected to the first reception filter 3. The selection terminal 522 is electrically connected to the second reception filter 4.

In the case of the carrier aggregation in which the first reception signal and the second reception signal are simultaneously communicated, the antenna switch 5 constantly connects the first reception filter 3 and the second reception filter 4 to the antenna 9. Specifically, the antenna switch 5 constantly connect the selection terminal 521 and the selection terminal 522 to the common terminal 51 in the carrier aggregation. Here, the carrier aggregation is communication in which radio waves in multiple frequency bands are simultaneously used.

When the carrier aggregation is not performed, the antenna switch 5 constantly connects one of the first reception filter 3 and the second reception filter 4 to the antenna 9 depending on the communication band used in the communication. For example, in the case of the communication using the first communication band, the antenna switch 5 connects the selection terminal 521 to the common terminal 51. In the case of the communication using the second communication band, the antenna switch 5 connects the selection terminal 522 to the common terminal 51.

In other words, the antenna switch 5 is connected to the antenna terminal 2, the first reception filter 3, and the second reception filter 4. The antenna switch 5 is capable of switching between a state in which the antenna terminal 2 is connected to the first reception filter 3 or the second reception filter 4 and a state in which the antenna terminal 2 is connected to both the first reception filter 3 and the second reception filter 4 depending on the communication mode.

(2.5) First Low Noise Amplifier

The first low noise amplifier 12 amplifies the first reception signal received through the antenna 9. An input terminal of the first low noise amplifier 12 is electrically connected to the antenna switch 5. An output terminal of the first low noise amplifier 12 is connected to a signal processing circuit 80 described below.

(2.6) Second Low Noise Amplifier

The second low noise amplifier 13 amplifies the second reception signal received through the antenna 9. An input terminal of the second low noise amplifier 13 is electrically connected to the antenna switch 5. An output terminal of the second low noise amplifier 13 is connected to the signal processing circuit 80.

(2.7) First Phase Adjustment Circuit

The first phase adjustment circuit 6 is provided on the first reception path R1. The first phase adjustment circuit 6 includes a first reactance element 61, a second reactance element 62, and a third reactance element 63. The first reactance element 61 is inserted in series onto the first reception path R1. The second reactance element 62 is provided between a first terminal of the first reactance element 61 and ground. The third reactance element 63 is provided between a second terminal of the first reactance element 61 and the ground. In other words, the first phase adjustment circuit 6 is a π-shaped circuit. The first phase adjustment circuit 6 includes an inductor L11 as the first reactance element 61, includes a capacitor C11 as the second reactance element 62, and includes a capacitor C12 as the third reactance element 63.

(2.8) Second Phase Adjustment Circuit

The second phase adjustment circuit 7 is provided on the second reception path R2. The second phase adjustment circuit 7 includes a first inductor L21 and a second inductor L22. The first inductor L21 is, for example, a chip inductor. The second inductor L22 is, for example, a chip inductor. One end of the first inductor L21 is connected to the second reception path R2 and the other end thereof is grounded. Specifically, the first inductor L21 is provided between a node on the second reception path R2 (signal path) and the ground. In other words, the first inductor L21 is shunt-connected on the second reception path R2. The second inductor L22 is inserted in series between the antenna switch 5 and the first inductor L21 on the second reception path R2. In other words, the second inductor L22 is connected in series (series-connected) between the antenna switch 5 and the first inductor L21 on the second reception path R2. In addition, in the second inductor L22, the variation in phase in the second frequency band is greater than that in the first frequency band.

(2.9) Mounting Substrate

The mounting substrate 100 has a first main surface 101 and a second main surface 102 that are opposed to each other in a first direction D1, which is the thickness direction of the mounting substrate 100. The mounting substrate 100 is, for example, a printed wiring board, low temperature co-fired ceramics (LTCC) substrate, high temperature co-fired ceramics (HTCC) substrate, or a resin substrate. Here, the mounting substrate 100 is, for example, a multilayer substrate including multiple dielectric layers and multiple conductive layers. The multiple dielectric layers and the multiple conductive layers are laminated in the first direction D1 of the mounting substrate 100. The multiple conductive layers are formed in predetermined patterns defined for the respective layers. Each of the multiple conductive layers includes one or more conductor portions in one plane surface orthogonal to the first direction D1 of the mounting substrate 100. The material of the respective conductive layers is, for example, copper. The multiple conductive layers include a ground layer. In the radio-frequency module 1, multiple ground terminals and the ground layer are electrically connected to each other via a via conductor and so on in the mounting substrate 100.

The mounting substrate 100 is not limited to the printed wiring board and the LTCC substrate and may be a wiring structure. The wiring structure is, for example, a multilayer structure. The multilayer structure includes at least one insulating layer and at least one conductive layer. The insulating layer is formed in a predetermined pattern. When the multiple insulating layers are provided, the multiple insulating layers are formed in predetermined patterns defined for the respective layers. The conductive layer is formed in a predetermined pattern different from that of the insulating layer. When the multiple conductive layers are provided, the multiple conductive layers are formed in predetermined patterns defined for the respective layers. The conductive layer may include one or more rewiring portions. In the wiring structure, a first surface, among the two surfaces opposed to each other in the thickness direction of the multilayer structure, is the first main surface 101 of the mounting substrate 100 and a second surface, among the two surfaces opposed to each other in the thickness direction of the multilayer structure, is the second main surface 102 of the mounting substrate 100. The wiring structure may be, for example, an interposer. The interposer may be an interposer using a silicon substrate or a substrate composed of multiple layers.

The first reception filter 3, the second reception filter 4, the first phase adjustment circuit 6, and the second phase adjustment circuit 7 are mounted on the first main surface 101. The second inductor L22 and the first inductor L21 in the second phase adjustment circuit 7 are connected to each other with surface wiring, such as a conductor pattern. Specifically, the second inductor L22 is connected to the first inductor L21 with a path R22 formed of the surface wiring, such as the conductor pattern (refer to FIG. 2B). The first inductor L21 is connected to the second reception filter 4 with the surface wiring. Specifically, the first inductor L21 is connected to the second reception filter 4 with a path R23 formed of the surface wiring (refer to FIG. 2B). Here, the surface wiring is a wiring conductor provided on the first main surface 101 of the mounting substrate 100.

Part of the first reception filter 3 may be mounted on the first main surface 101 of the mounting substrate 100 and the remaining portion of the first reception filter 3 may be mounted in the mounting substrate 100. In other words, the first reception filter 3 is disposed at the first main surface 101 side with respect to the second main surface 102 of the mounting substrate 100 and at least includes the portion mounted on the first main surface 101.

Part of the second reception filter 4 may be mounted on the first main surface 101 of the mounting substrate 100 and the remaining portion of the second reception filter 4 may be mounted in the mounting substrate 100. In other words, the second reception filter 4 is disposed at the first main surface 101 side with respect to the second main surface 102 of the mounting substrate 100 and at least includes the portion mounted on the first main surface 101.

Part of the first phase adjustment circuit 6 may be mounted on the first main surface 101 of the mounting substrate 100 and the remaining portion of the first phase adjustment circuit 6 may be mounted in the mounting substrate 100. In other words, the first phase adjustment circuit 6 is disposed at the first main surface 101 side with respect to the second main surface 102 of the mounting substrate 100 and at least includes the portion mounted on the first main surface 101.

Part of the second phase adjustment circuit 7 may be mounted on the first main surface 101 of the mounting substrate 100 and the remaining portion of the second phase adjustment circuit 7 may be mounted in the mounting substrate 100. In other words, the second phase adjustment circuit 7 is disposed at the first main surface 101 side with respect to the second main surface 102 of the mounting substrate 100 and at least includes the portion mounted on the first main surface 101. For example, the first inductor L21 may be mounted on the first main surface 101 and the second inductor L22 may be mounted in the mounting substrate 100. In this case, the second inductor L22 is connected to the first inductor L21 with a path formed of an inner wiring conductor that is composed of a wiring portion (wiring conductor) and a via conductor, which are provided in the mounting substrate 100.

When the first inductor L21 is mounted in the mounting substrate 100, the first inductor L21 is connected to the second reception filter 4 with a path formed of an inner wiring conductor that is composed of a wiring conductor and a via conductor, which are provided in the mounting substrate 100.

A switch integrated circuit (IC) 110 is mounted on the second main surface 102. The switch IC 110 includes the antenna switch 5 and the multiple amplifiers 11 (the first low noise amplifier 12 and the second low noise amplifier 13), which are formed into one chip. The antenna switch 5 is connected to the second inductor L22 with a path R21 formed of a via conductor 95 provided in the mounting substrate 100. The second reception filter 4 is connected to the second low noise amplifier 13 with a path R25 formed of a via conductor 96 provided in the mounting substrate 100.

Part of the switch IC 110 may be mounted on the second main surface 102 of the mounting substrate 100 and the remaining portion of the switch IC 110 may be mounted in the mounting substrate 100. In other words, the switch IC 110 is disposed at the second main surface 102 side with respect to the first main surface 101 of the mounting substrate 100 and at least includes the portion mounted on the second main surface 102.

The respective components provided on the first main surface 101 and the second main surface 102 are electrically connected to the mounting substrate 100 with, for example, solder bumps. The solder bumps are disposed between the components that are disposed and the mounting substrate 100 in the thickness direction (the first direction D1) of the mounting substrate 100. The second reception path R2 described above includes the paths R21, R22, and R23 described above.

(2.10) Other Components

Other components in the radio-frequency module 1 will now be described.

FIG. 2A is a plan view when the radio-frequency module 1 is viewed from the first direction D1. FIG. 2B is a cross-sectional view of the radio-frequency module 1.

The radio-frequency module 1 is provided with multiple external connection electrodes 90 (refer to FIG. 2B). The radio-frequency module 1 is connected to a mother board on which the signal processing circuit 80 and so on are mounted with the multiple external connection electrodes 90. The multiple external connection electrodes 90 are columnar (for example, cylindrical) electrodes disposed (provided) on the second main surface 102 of the mounting substrate 100. The material of the multiple external connection electrodes 90 is, for example, metal (for example, copper, copper alloy, or the like). The multiple external connection electrodes 90 include the antenna terminal 2 and the ground terminals used for grounding.

The radio-frequency module 1 accepts a signal received through the antenna 9 via the antenna terminal 2, which is one external connection electrode 90 in the multiple external connection electrodes 90, and supplies the signal to the signal processing circuit 80 via another external connection electrode 90.

The radio-frequency module 1 further includes a first resin layer 120 on the first main surface 101 of the mounting substrate 100. Electronic components including the first reception filter 3, the second reception filter 4, the first phase adjustment circuit 6, and the second phase adjustment circuit 7, which are mounted on the first main surface 101, are covered with the first resin layer 120. The radio-frequency module 1 further includes a second resin layer 130 on the second main surface 102 of the mounting substrate 100. Electronic components including the switch IC 110 mounted on the second main surface 102 are covered with the second resin layer 130. The material of the second resin layer 130 may be the same as that of the first resin layer 120 or may be different from that of the first resin layer 120. The first resin layer 120 is omitted in FIG. 2A.

The antenna switch 5, the first low noise amplifier 12, the second low noise amplifier 13 are disposed on the second main surface 102 of the mounting substrate 100, as described above (refer to FIG. 2B).

The first phase adjustment circuit 6, the second phase adjustment circuit 7, the first reception filter 3, and the second reception filter 4 are disposed on the first main surface 101 of the mounting substrate 100 (refer to FIG. 2A).

The first phase adjustment circuit 6 and the first reception filter 3 are disposed in this order along a second direction D2.

The second inductor L22 and the first inductor L21 in the second phase adjustment circuit 7 and the second reception filter 4 are disposed in this order along the second direction D2 orthogonal to the first direction D1. The second inductor L22 is connected to the antenna switch 5 via the path R21 included in the second reception path R2 (refer to FIG. 2B). The second reception filter 4 is connected to the second low noise amplifier 13 via the path R25 (refer to FIG. 2B).

In the first embodiment, in a plan view of the mounting substrate 100, that is, when the mounting substrate 100 is viewed from the first direction D1, the second inductor L22 is overlapped with the antenna switch 5 (refer to FIG. 2A and FIG. 2B). In a plan view of the mounting substrate 100, part of the second inductor L22 may be overlapped with the antenna switch 5. In other words, in a plan view of the mounting substrate 100, it is sufficient for at least part of the second inductor L22 to be overlapped with the antenna switch 5.

In the first embodiment, in a plan view of the mounting substrate 100, the first inductor L21 is overlapped with the antenna switch 5 (refer to FIG. 2A and FIG. 2B). In a plan view of the mounting substrate 100, part of the first inductor L21 may be overlapped with the antenna switch 5. In other words, in a plan view of the mounting substrate 100, it is sufficient for at least part of the first inductor L21 to be overlapped with the antenna switch 5.

In a plan view of the mounting substrate 100, at least part of the first reception filter 3 is overlapped with the first low noise amplifier 12 (refer to FIG. 2A). In a plan view of the mounting substrate 100, part of the first reception filter 3 may be overlapped with the first low noise amplifier 12. In other words, in a plan view of the mounting substrate 100, it is sufficient for at least part of the first reception filter 3 to be overlapped with the first low noise amplifier 12.

In a plan view of the mounting substrate 100, at least part of the second reception filter 4 is overlapped with the second low noise amplifier 13 (refer to FIG. 2A and FIG. 2B). In a plan view of the mounting substrate 100, part of the second reception filter 4 may be overlapped with the second low noise amplifier 13. In other words, in a plan view of the mounting substrate 100, it is sufficient for at least part of the second reception filter 4 to be overlapped with the second low noise amplifier 13.

Here, the path length between the antenna switch 5 and the second inductor L22 on the second reception path R2 is denoted by "A1". Specifically, on the second reception path R2, the length from the selection terminal 522 of the antenna switch 5 to one end of the second inductor L22, for example, the length of the path R21 (refer to FIG. 2B) is denoted by "A1" (refer to FIG. 1).

In addition, the path length between the first inductor L21 and the second inductor L22 on the second reception path R2 is denoted by "A2". Specifically, on the second reception path R2, the length from the other end of the second inductor L22 to a node with the first inductor L21, for example, the length of the path R22 (refer to FIG. 2B) is denoted by "A2" (refer to FIG. 1).

Furthermore, the path length between the first inductor L21 and the second reception filter 4 on the second reception path R2 is denoted by "A3". Specifically, on the second reception path R2, the length from the node with the first inductor L21 to an input terminal of the second reception filter 4, for example, the length of the path R23 (refer to FIG. 2B) is denoted by "A3" (refer to FIG. 1).

The first inductor L21 and the second inductor L22 are disposed so that both a first inequality "A1>A2" and a second inequality "A1>A3" are established. The first inductor L21 and the second inductor L22 may be disposed so that one of the first inequality "A1>A2" and the second inequality "A1>A3" is established. In other words, it is sufficient for the first inductor L21 and the second inductor L22 to be disposed so that at least one of the first inequality and the second inequality is established.

In the first embodiment, the path length "A1" is longer than the path length "A2". The path length "A1" is longer than the path length "A3".

(3) Operation of the Radio-Frequency Module

The operation of the radio-frequency module 1 according to the first embodiment will now be described with reference to FIG. 1.

First, a case is described in which only the signal in the first communication band is communicated. In this case, the antenna switch 5 selects the selection terminal 521 as the terminal to which the common terminal 51 is connected. In other words, the first reception filter 3 is electrically connected to the antenna 9. The first reception signal received through the antenna 9 is input into the first reception filter 3 via the antenna switch 5 and the first phase adjustment circuit 6.

Next, a case is described in which only the signal in the second communication band is communicated. In this case, the antenna switch 5 selects the selection terminal 522 as the terminal to which the common terminal 51 is connected. In other words, the second reception filter 4 is electrically connected to the antenna 9. The second reception signal received through the antenna 9 is input into the second reception filter 4 via the antenna switch 5 and the second phase adjustment circuit 7.

Next, a case of the carrier aggregation is described in which the signal in the first communication band and the signal in the second communication band are simultaneously communicated. In this case, the antenna switch 5 selects the selection terminal 521 and the selection terminal 522 as the terminals to which the common terminal 51 is connected. The first reception filter 3 and the second reception filter 4 are electrically connected to the antenna 9. The first reception signal and the second reception signal, received through the antenna 9, are input into the first reception filter 3 via the antenna switch 5 and the first phase adjustment circuit 6. The first reception signal and the second reception signal, received through the antenna 9, are input into the second reception filter 4 via the antenna switch 5 and the second phase adjustment circuit 7.

(4) Communication Apparatus

The communication apparatus 8 includes the radio-frequency module 1 and the signal processing circuit 80, as illustrated in FIG. 1. The signal processing circuit 80 performs signal processing of the signal in the first communication band and the signal in the second communication band. The signal processing circuit 80 includes a baseband signal processing circuit 81 and a radio-frequency (RF) signal processing circuit 82.

(4.1) Baseband Signal Processing Circuit

The baseband signal processing circuit 81 is, for example, a baseband integrated circuit (BBIC) and is electrically connected to the RF signal processing circuit 82, as illustrated in FIG. 1. The baseband signal processing circuit 81 generates an I-phase signal and a Q-phase signal from a baseband signal. The baseband signal processing circuit 81 performs IQ modulation by combining the I-phase signal with the Q-phase signal and outputs a transmission signal. At this time, the transmission signal is generated as a modulation signal resulting from amplitude modulation of a carrier-wave signal of a predetermined frequency with a period longer than the period of the carrier signal.

(4.2) RF Signal Processing Circuit

The RF signal processing circuit 82 is, for example, a radio-frequency integrated circuit (RFIC) and is provided between the radio-frequency module 1 and the baseband signal processing circuit 81, as illustrated in FIG. 1. The RF signal processing circuit 82 has a function to perform the signal processing to the transmission signal supplied from the baseband signal processing circuit 81 and a function to perform the signal processing to a reception signal received through the antenna 9. The RF signal processing circuit 82 is a multiband processing circuit and is capable of generating the transmission signals in multiple communication bands and amplifying the generated transmission signals.

(5) Advantages

Advantages of the radio-frequency module 1 according to the first embodiment will now be described.

(5.1) First Advantage

A radio-frequency module in a comparative example does not include an inductor that is series-coupled between an inductor that is shunt-connected and an antenna switch. In the radio-frequency module in the comparative example, when one filter (acoustic-wave filter) and another filter (acoustic-wave filter), among multiple filters, are simultaneously used for communication, the provision of the inductor that is shunt-connected enables the frequency band of the other filter to have an open end in the one filter. However, when the frequency band through the one filter is higher than the frequency band through the other filter, the impedance in the frequency band through the one filter in the communication using the one filter may be shifted from the impedance in the frequency band through the one filter in the communication simultaneously using the one filter and the other filter.

In order to resolve the above problem, the radio-frequency module 1 according to the first embodiment is capable of simultaneously communicating the signal in the first communication band (for example, Band3) and the signal in the second communication band (for example, Band41) including the second frequency band higher than the first frequency band of the first communication band. The radio-frequency module 1 includes a first acoustic-wave filter (for example, the first reception filter 3), a second acoustic-wave filter (for example, the second reception filter 4), a switch (the antenna switch 5), the first inductor L21, and the second inductor L22. The first acoustic-wave filter transmits the signal in the first communication band. The second acoustic-wave filter transmits the signal in the second communication band. The switch is connected to the antenna terminal 2, the first acoustic-wave filter, and the second acoustic-wave filter. The switch is capable of switching between a state in which the antenna terminal 2 is connected to the first reception filter 3 or the second reception filter 4 and a state in which the antenna terminal 2 is connected to both the first reception filter 3 and the second reception filter 4 depending on the communication mode. The first inductor L21 is shunt-connected on the signal path (for example, the second reception path R2) between the switch and the second acoustic-wave filter. The second inductor L22 is series-connected between the switch and the first inductor L21 on the signal path. In the second inductor L22, the variation in phase in the second frequency band is greater than that in the first frequency band.

A first advantage of the first embodiment will now be described.

FIG. 3A, FIG. 4A, FIG. 4C, and FIG. 4E are Smith charts indicating the impedance of the second reception filter 4 for the second communication band. FIG. 3B, FIG. 4B, FIG. 4D, and FIG. 4F are Smith charts indicating the impedance of the second reception filter 4 for the first communication band. In each of FIG. 3A, FIG. 3B, and FIG. 4A to FIG. 4F, the straight line horizontally extending through the center of the chart is the axis (resistance axis) representing the resistance component of the impedance. The scales on the resistance axis are normalized. The scale on the extreme left is 0Ω the scale at the center of the chart is 1.0 (50Ω), and the scale on the extreme right is infinity (open). In each of FIG. 3A to FIG. 4F, the lower side of the resistance axis represents capacitive impedance and the upper side of the resistance axis represents inductive impedance.

Figure 3A:
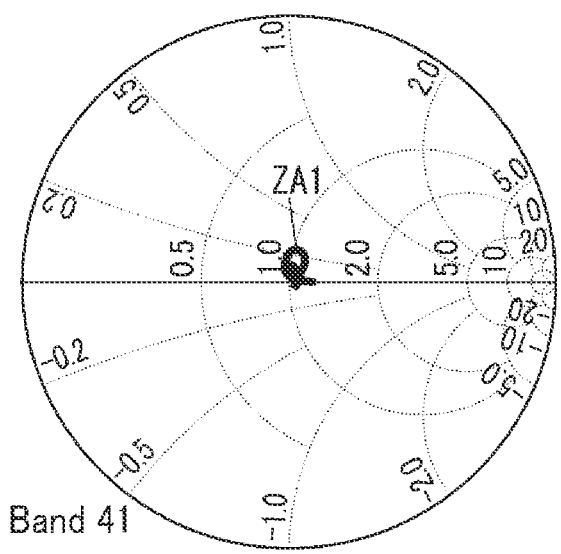
FIG. 3A is a Smith chart indicating the impedance of a second reception filter for a second communication band in the radio-frequency module in FIG. 1
Figure 3B:
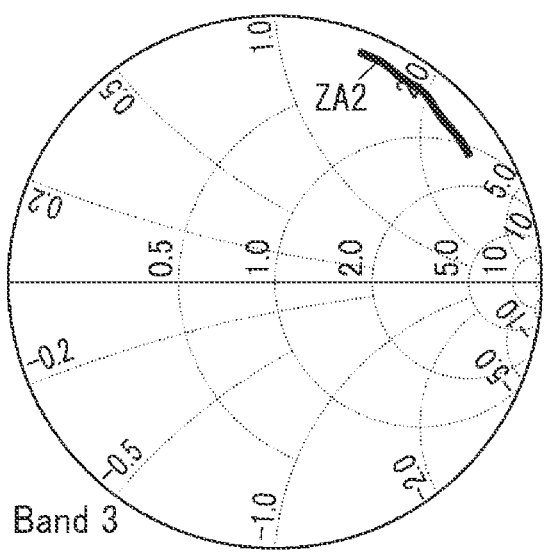
FIG. 3B is a Smith chart indicating the impedance of the second reception filter for a first communication band in the radio-frequency module in FIG. 1.

FIG. 3A is the Smith chart indicating a state in which impedance matching of the second reception filter 4 is achieved for the second communication band in the communication only in the second communication band (Band41). FIG. 3B is the Smith chart indicating the impedance of the second reception filter 4 for the first communication band (Band3) when the impedance matching of the second reception filter 4 is achieved for the second communication band in the above communication.

Figure 4A:
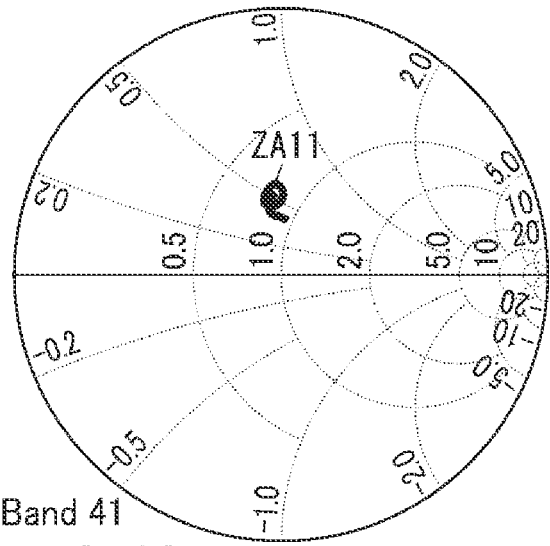
FIG. 4A is a Smith chart indicating the impedance of the second reception filter for the second communication band when a second inductor is inserted in the radio-frequency module in FIG. 1.
Figure 4B:
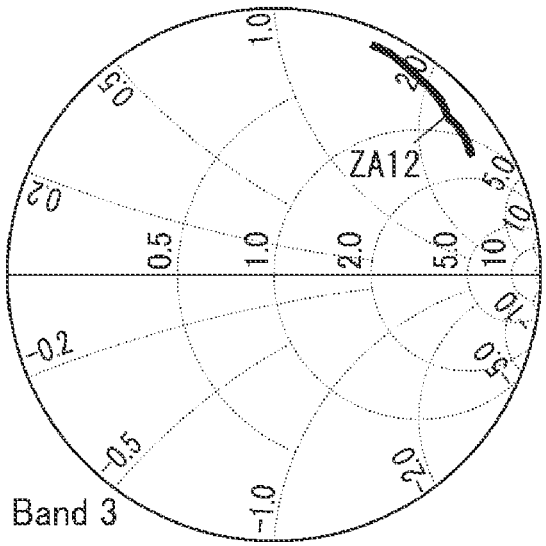
FIG. 4B is a Smith chart indicating the impedance of the second reception filter for the first communication band when the second inductor is inserted in the radio-frequency module in FIG. 1.

FIG. 4A is the Smith chart indicating the impedance of the second reception filter 4 for the second communication band when the second inductor L22 is inserted and the communication (the carrier aggregation) is performed in which the first communication band (Band3) and the second communication band (Band41) are simultaneously used. FIG. 4B is the Smith chart indicating the impedance of the second reception filter 4 for the first communication band when the second inductor L22 is inserted and the communication is performed in which the first communication band and the second communication band are simultaneously used.

Figure 4C:
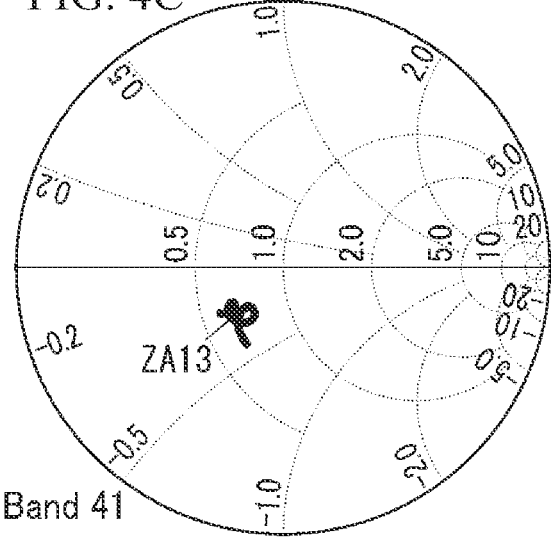
FIG. 4C is a Smith chart indicating the impedance of the second reception filter for the second communication band when a first inductor is used in the radio-frequency module in FIG. 1.
Figure 4D:
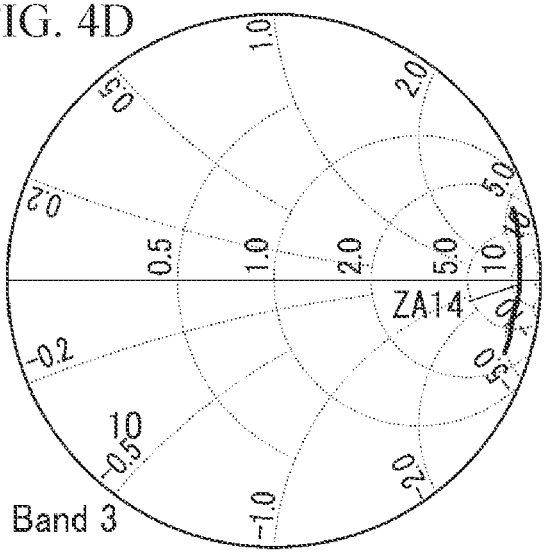
FIG. 4D is a Smith chart indicating the impedance of the second reception filter for the first communication band when the first inductor is used in the radio-frequency module in FIG. 1.

FIG. 4C is the Smith chart indicating the impedance of the second reception filter 4 for the second communication band when the communication is performed in which the first communication band (Band3) and the second communication band (Band41) are simultaneously used and the impedance matching is performed using the first inductor L21. FIG. 4D is the Smith chart indicating the impedance of the second reception filter 4 for the first communication band when the communication is performed in which the first communication band and the second communication band are simultaneously used and the impedance matching is performed using the first inductor L21.

Figure 4E:
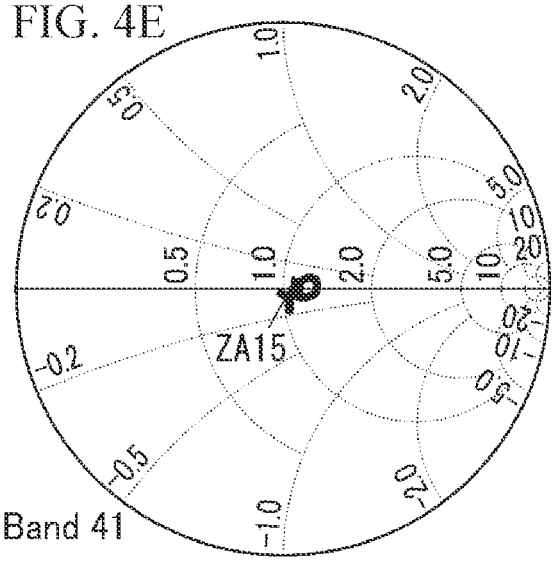
FIG. 4E is a Smith chart indicating the impedance of the second reception filter for the second communication band when the first inductor and the second inductor are used in the radio-frequency module in FIG. 1.
Figure 4F:
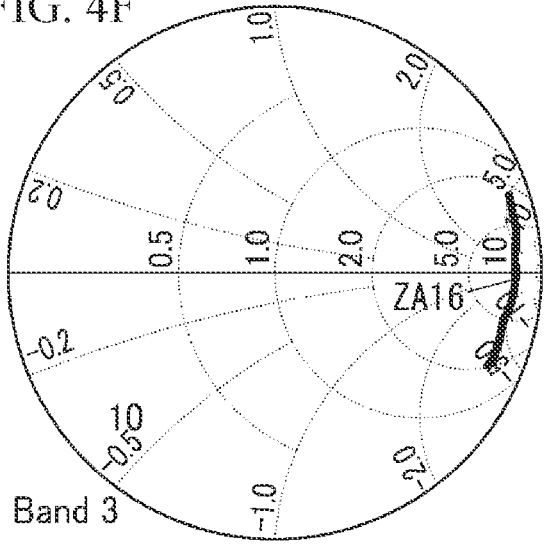
FIG. 4F is a Smith chart indicating the impedance of the second reception filter for the first communication band when the first inductor and the second inductor are used in the radio-frequency module in FIG. 1.

FIG. 4E is the Smith chart indicating the impedance of the second reception filter 4 for the second communication band when the communication is performed in which the first communication band (Band3) and the second communication band (Band41) are simultaneously used and the impedance matching is performed using the first inductor L21 and the second inductor L22. FIG. 4F is the Smith chart indicating the impedance of the second reception filter 4 for the first communication band when the communication is performed in which the first communication band (Band3) and the second communication band (Band41) are simultaneously used and the impedance matching is performed using the first inductor L21 and the second inductor L22.

Referring to FIG. 3A, ZA1 indicates the impedance of the second reception filter 4 in the frequency band of the second communication band when the second reception filter 4 side is viewed from the selection terminal 522 in the antenna switch 5 in FIG. 1 in the communication only in the second communication band. Referring to FIG. 3B, ZA2 indicates the impedance of the second reception filter 4 in the frequency band of the first communication band when the first reception filter 3 side is viewed from the selection terminal 522 in the communication only in the second communication band.

As indicated in FIG. 3A, the impedance matching of the second reception filter 4 is achieved in the second communication band.

Referring to FIG. 4A, ZA11 indicates the impedance of the second reception filter 4 in the frequency band of the second communication band when the second reception filter 4 side is viewed from the selection terminal 522 in the communication in which the first communication band and the second communication band are simultaneously used. Referring to FIG. 4B, ZA12 indicates the impedance of the second reception filter 4 in the frequency band of the first communication band when the first reception filter 3 side is viewed from the selection terminal 522 in the communication in which the first communication band and the second communication band are simultaneously used.

The second inductor L22 is series-connected on the second reception path R2. In addition, the variation in phase in the second frequency band is greater than that in the first frequency band in the second inductor L22. Accordingly, the impedance of the second reception filter 4 in the second communication band is shifted from the matching state to the inductive impedance, as indicated in FIG. 4A. The impedance of the second reception filter 4 in the first communication band is the inductive impedance, as indicated in FIG. 4B.

Referring to FIG. 4C, ZA13 indicates the impedance of the second reception filter 4 in the frequency band of the second communication band when the second reception filter 4 side is viewed from the selection terminal 522 in the communication in which the first communication band and the second communication band are simultaneously used. Referring to FIG. 4D, ZA14 indicates the impedance of the second reception filter 4 in the frequency band of the first communication band when the first reception filter 3 side is viewed from the selection terminal 522 in the communication in which the first communication band and the second communication band are simultaneously used.

Since the first inductor L21 is shunt-connected on the second reception path R2, the first inductor L21 is appropriate for performing the impedance matching for the low frequency band. The impedance of the second reception filter 4 in the second communication band is shifted from the matching state to the capacitive impedance, as indicated in FIG. 4C. The impedance of the second reception filter 4 in the first communication band is shifted to the neighborhood of the open end, as indicated in FIG. 4D.

Referring to FIG. 4E, ZA15 indicates the impedance of the second reception filter 4 in the frequency band of the second communication band when the second reception filter 4 side is viewed from the selection terminal 522 in the communication in which the first communication band and the second communication band are simultaneously used. Referring to FIG. 4F, ZA16 indicates the impedance of the second reception filter 4 in the frequency band of the first communication band when the first reception filter 3 side is viewed from the selection terminal 522 in the communication in which the first communication band and the second communication band are simultaneously used.

The impedance of the second reception filter 4 in the second communication band is kept in the matching state, as indicated in FIG. 4E. The impedance of the second reception filter 4 in the first communication band is shifted to the neighborhood of the open end, as indicated in FIG. 4F.

ZA15 in FIG. 4E indicates the impedance of the second reception filter 4 for the second communication band when the communication is performed in which the first communication band and the second communication band are simultaneously used and the impedance matching is performed using the first inductor L21 and the second inductor L22.

When the communication is performed in which the first communication band and the second communication band are simultaneously used, it is suitable to suppress the shift in impedance of the second reception filter 4 in the frequency band of the second communication band and to make the impedance of the second reception filter in the frequency band of the first communication band open.

As a result, performing the impedance matching using the first inductor L21 and the second inductor L22 keeps the impedance of the second reception filter 4 for the second communication band in the matching state and makes the impedance of the second reception filter 4 for the first communication band open. Consequently, it is possible to achieve more excellent impedance characteristics in the communication in which the first communication band and the second communication band are simultaneously used.

(5.2) Second Advantage

In the first embodiment, the path length "A1" of the path R21 between the antenna switch 5 and the second inductor L22 on the signal path (the second reception path R2) is longer than the path length "A2" of the path R22 between the first inductor L21 and the second inductor L22 on the second reception path R2.

A second advantage of the first embodiment will now be described.

Parasitic capacitance may occur on each of the path R21 and the path R22.

Figure 5A:
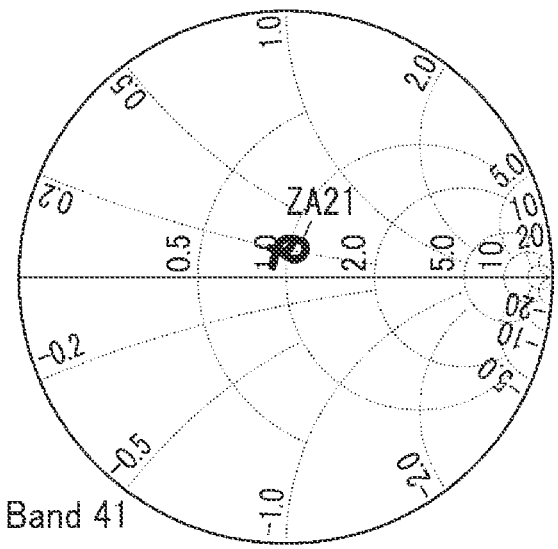
FIG. 5A is a Smith chart indicating the impedance of the second reception filter for the second communication band when parasitic capacitance occurs between the first inductor and the second inductor in the radio-frequency module in FIG. 1.
Figure 5B:
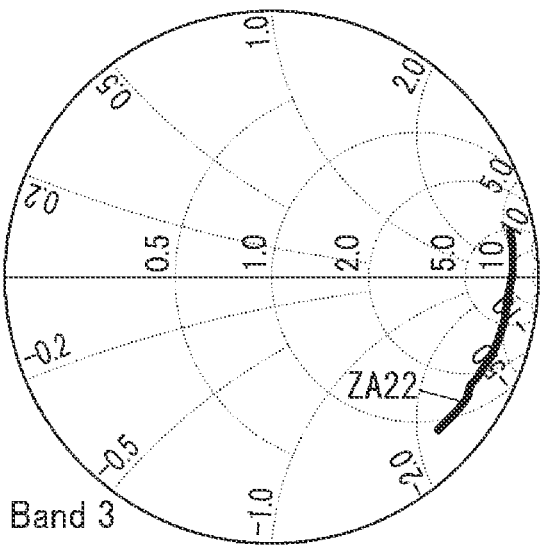
FIG. 5B is a Smith chart indicating the impedance of the second reception filter for the first communication band when the parasitic capacitance occurs between the first inductor and the second inductor in the radio-frequency module in FIG. 1.
Figure 5C:
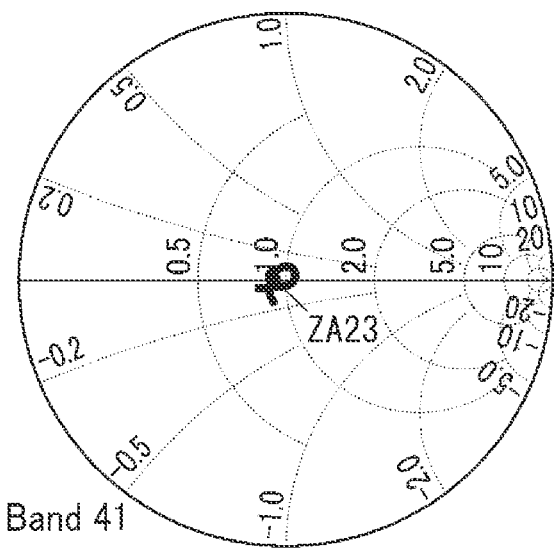
FIG. 5C is a Smith chart indicating the impedance of the second reception filter for the second communication band when the parasitic capacitance occurs between an antenna switch and the second inductor in the radio-frequency module in FIG. 1.
Figure 5D:
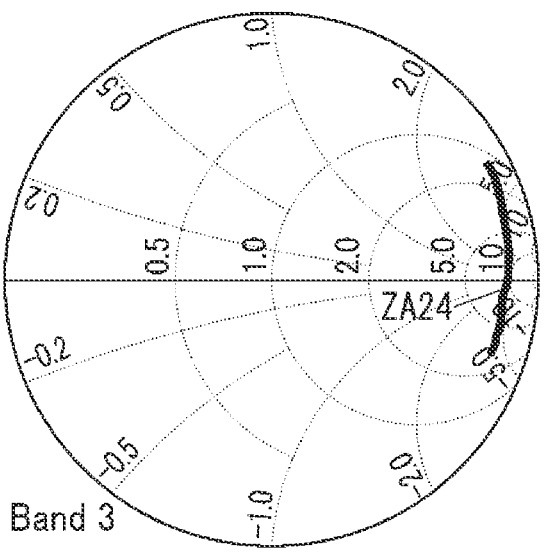
FIG. 5D is a Smith chart indicating the impedance of the second reception filter for the first communication band when the parasitic capacitance occurs between the antenna switch and the second inductor in the radio-frequency module in FIG. 1.

FIG. 5A is a Smith chart indicating the impedance of the second reception filter 4 for the second communication band (Band41) when the parasitic capacitance occurs on the path R22. FIG. 5B is a Smith chart indicating the impedance of the second reception filter 4 for the first communication band (Band3) when the parasitic capacitance occurs on the path R22. FIG. 5C is a Smith chart indicating the impedance of the second reception filter 4 for the second communication band when the parasitic capacitance occurs on the path R21. FIG. 5D is a Smith chart indicating the impedance of the second reception filter 4 for the first communication band when the parasitic capacitance occurs on the path R21. In each of FIG. 5A to FIG. 5D, the straight line horizontally extending through the center of the chart is the axis (resistance axis) representing the resistance component of the impedance. The scales on the resistance axis are normalized. The scale on the extreme left is 0Ω the scale at the center of the chart is 1.0 (50Ω), and the scale on the extreme right is infinity (open). In each of FIG. 5A to FIG. 5D, the lower side of the resistance axis represents capacitive impedance and the upper side of the resistance axis represents inductive impedance.

Referring to FIG. 5A, ZA21 indicates the impedance of the second reception filter 4 in the frequency band of the second communication band when the second reception filter 4 side is viewed from the selection terminal 522 in the communication in which the first communication band and the second communication band are simultaneously used.

Referring to FIG. 5B, ZA22 indicates the impedance of the second reception filter 4 in the frequency band of the first communication band when the first reception filter 3 side is viewed from the selection terminal 522 in the communication in which the first communication band and the second communication band are simultaneously used.

When the parasitic capacitance occurs on the path R22, the impedance of the second reception filter 4 in the second communication band is substantially equivalent to the matching state, as indicated in FIG. 5A. When the parasitic capacitance occurs on the path R22, the impedance of the second reception filter 4 in the first communication band is greatly shifted from the neighborhood of the open end, as indicated in FIG. 5B.

Referring to FIG. 5C, ZA23 indicates the impedance of the second reception filter 4 in the frequency band of the second communication band when the second reception filter 4 side is viewed from the selection terminal 522 in the communication in which the first communication band and the second communication band are simultaneously used. Referring to FIG. 5D, ZA24 indicates the impedance of the second reception filter 4 in the frequency band of the first communication band when the first reception filter 3 side is viewed from the selection terminal 522 in the communication in which the first communication band and the second communication band are simultaneously used.

When the parasitic capacitance occurs on the path R21, the impedance of the second reception filter 4 in the second communication band is kept in the matching state, as indicated in FIG. 5C. When the parasitic capacitance occurs on the path R21, the amount of shift from the neighborhood of the open end of the impedance of the second reception filter 4 in the first communication band is smaller than that in FIG. 5B, as indicated in FIG. 5D.

Since the parasitic capacitance occurring between the components is proportional to the path length between the components, the amount of shift from the open end of the impedance of the second reception filter 4 in the first communication band, which is caused by the occurrence of the parasitic capacitance, is decreased by establishing the relationship "A1>A2" between the path length "A1" of the path R21 and the path length "A2" of the path R22. Consequently, it is possible to achieve more excellent impedance characteristics in the communication in which the first communication band and the second communication band are simultaneously used.

(5.3) Third Advantage

In the first embodiment, the path length "A1" between the antenna switch 5 and the second inductor L22 on the signal path (the second reception path R2) is longer than the path length "A3" between the first inductor L21 and second reception filter 4 on the second reception path R2.

A third advantage of the first embodiment will now be described.

Parasitic inductor may occur on each of the path R21 and the path R23.

Figure 6A:
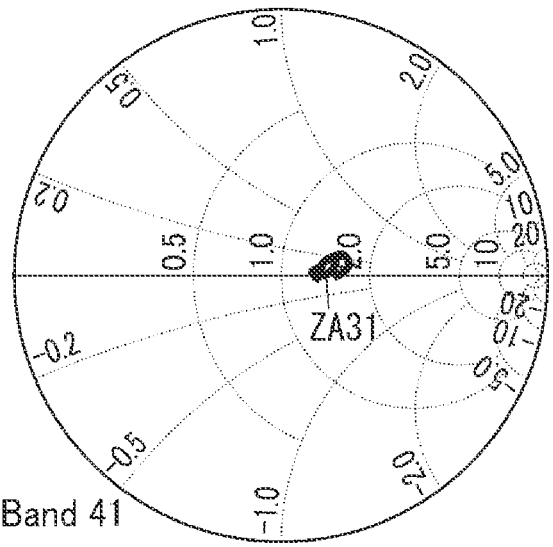
FIG. 6A is a Smith chart indicating the impedance of the second reception filter for the second communication band when parasitic inductor occurs between the first inductor and the second inductor in the radio-frequency module in FIG. 1.
Figure 6B:
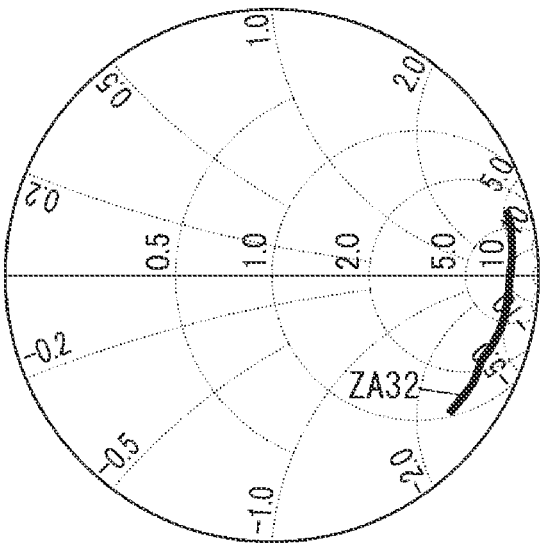
FIG. 6B is a Smith chart indicating the impedance of the second reception filter for the first communication band when the parasitic inductor occurs between the first inductor and the second inductor in the radio-frequency module in FIG. 1.
Figure 6C:
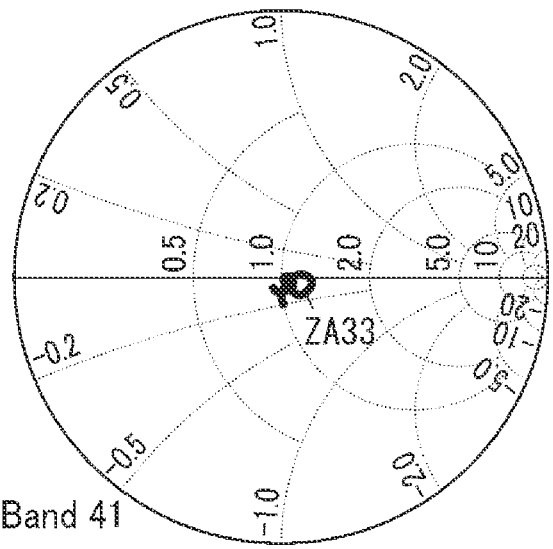
FIG. 6C is a Smith chart indicating the impedance of the second reception filter for the second communication band when the parasitic inductor occurs between the antenna switch and the second inductor in the radio-frequency module in FIG. 1.
Figure 6D:
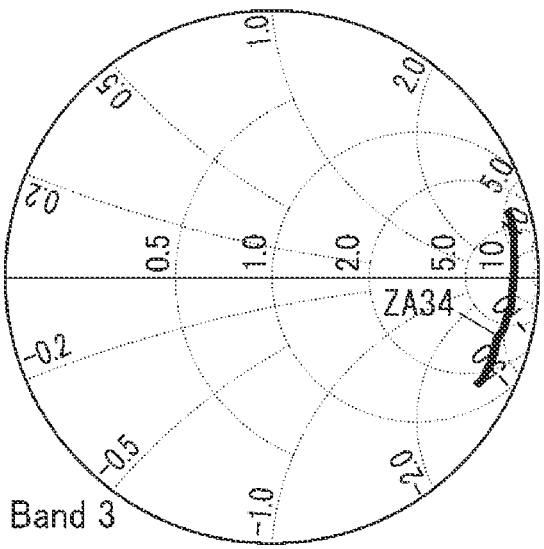
FIG. 6D is a Smith chart indicating the impedance of the second reception filter for the first communication band when the parasitic inductor occurs between the antenna switch and the second inductor in the radio-frequency module in FIG. 1.

FIG. 6A is a Smith chart indicating the impedance of the second reception filter 4 for the second communication band (Band41) when the parasitic inductor occurs on the path R23. FIG. 6B is a Smith chart indicating the impedance of the second reception filter 4 for the first communication band (Band3) when the parasitic inductor occurs on the path R23. FIG. 6C is a Smith chart indicating the impedance of the second reception filter 4 for the second communication band when the parasitic inductor occurs on the path R21. FIG. 6D is a Smith chart indicating the impedance of the second reception filter 4 for the first communication band when the parasitic inductor occurs on the path R21. In each of FIG. 6A to FIG. 6D, the straight line horizontally extending through the center of the chart is the axis (resistance axis) representing the resistance component of the impedance. The scales on the resistance axis are normalized. The scale on the extreme left is 0Ω the scale at the center of the chart is 1.0 (50Ω), and the scale on the extreme right is infinity (open). In each of FIG. 6A to FIG. 6D, the lower side of the resistance axis represents capacitive impedance and the upper side of the resistance axis represents inductive impedance.

Referring to FIG. 6A, ZA31 indicates the impedance of the second reception filter 4 in the frequency band of the second communication band when the second reception filter 4 side is viewed from the selection terminal 522 in the communication in which the first communication band and the second communication band are simultaneously used. Referring to FIG. 6B, ZA32 indicates the impedance of the second reception filter 4 in the frequency band of the first communication band when the first reception filter 3 side is viewed from the selection terminal 522 in the communication in which the first communication band and the second communication band are simultaneously used.

When the parasitic inductor occurs on the path R23, the impedance of the second reception filter 4 in the second communication band is substantially equivalent to the matching state, as indicated in FIG. 6A. When the parasitic inductor occurs on the path R23, the impedance of the second reception filter 4 in the first communication band is greatly shifted from the neighborhood of the open end, as indicated in FIG. 6B.

Referring to FIG. 6C, ZA33 indicates the impedance of the second reception filter 4 in the frequency band of the second communication band when the second reception filter 4 side is viewed from the selection terminal 522 in the communication in which the first communication band and the second communication band are simultaneously used. Referring to FIG. 6D, ZA34 indicates the impedance of the second reception filter 4 in the frequency band of the first communication band when the first reception filter 3 side is viewed from the selection terminal 522 in the communication in which the first communication band and the second communication band are simultaneously used.

When the parasitic inductor occurs on the path R21, the impedance of the second reception filter 4 in the second communication band is kept in the matching state, as indicated in FIG. 6C. When the parasitic inductor occurs on the path R21, the amount of shift from the neighborhood of the open end of the impedance of the second reception filter 4 in the first communication band is smaller than that in FIG. 6B, as indicated in FIG. 6D.

Since the parasitic inductor occurring between the components is proportional to the path length between the components, the amount of shift from the open end of the impedance of the second reception filter 4 in the first communication band, which is caused by the occurrence of the parasitic inductor, is decreased by establishing the relationship "A1>A3" between the path length "A1" of the path R21 and the path length "A3" of the path R23. Consequently, it is possible to achieve more excellent impedance characteristics in the communication in which the first communication band and the second communication band are simultaneously used.

(6) Modifications

Modifications of the first embodiment will now be described.

(6.1) First Modification

Although the radio-frequency module 1 is configured to include the mounting substrate 100 in which the components are disposed on both the first main surface 101 and the second main surface 102, which are opposed to each other in the first direction D1, in the first embodiment, the radio-frequency module 1 is not limited to this configuration.

The mounting substrate 100 may be a mounting substrate capable of single sided mounting in which the components are mounted on one main surface, among the first main surface 101 and the second main surface 102, for example, on the first main surface.

Figure 7A:
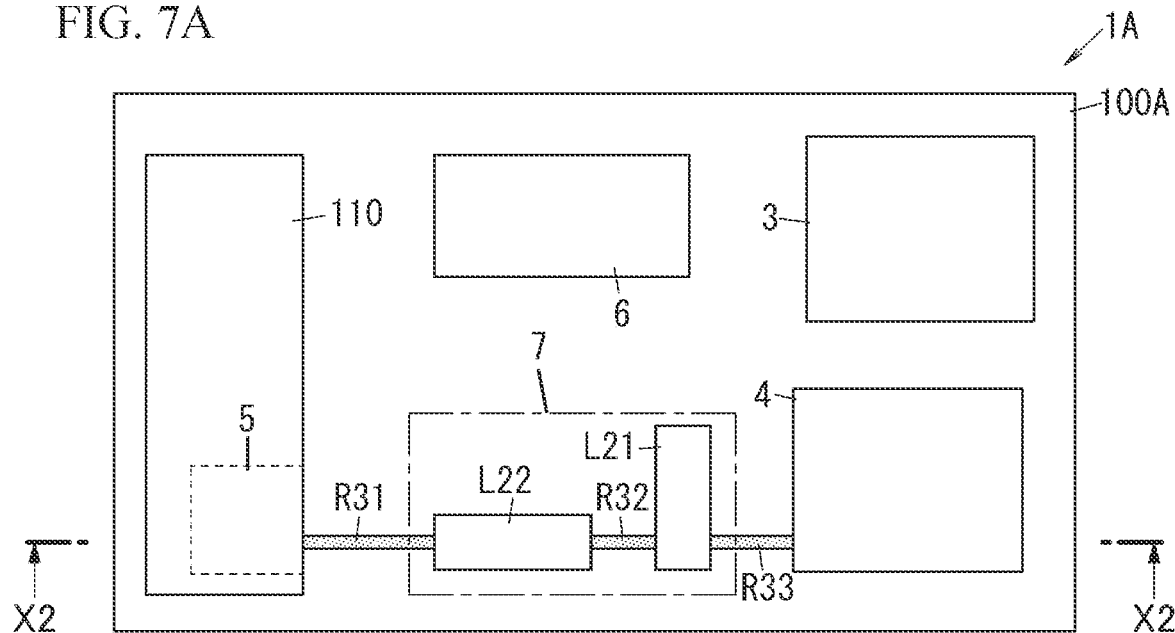
FIG. 7A is a plan view of a radio-frequency module according to a first modification of the first embodiment and FIG. 7B is a cross-sectional view of the radio-frequency module in FIG. 7A taken along an X2-X2 line.

A mounting substrate 100A of the present modification is, for example, a printed wiring board, LTCC substrate, HTCC substrate, or a resin substrate, like the mounting substrate 100. Here, the mounting substrate 100A is, for example, a multilayer substrate including multiple dielectric layers and multiple conductive layers, like the mounting substrate 100. The mounting substrate 100A is not limited to the printed wiring board and the LTCC substrate and may be a wiring structure. The first resin layer 120 is omitted in FIG. 7A, as in FIG. 2A.

The first reception filter 3, the second reception filter 4, the first phase adjustment circuit 6, the second phase adjustment circuit 7, and the switch IC 110 are mounted on a first main surface 101A.

Figure 7B:
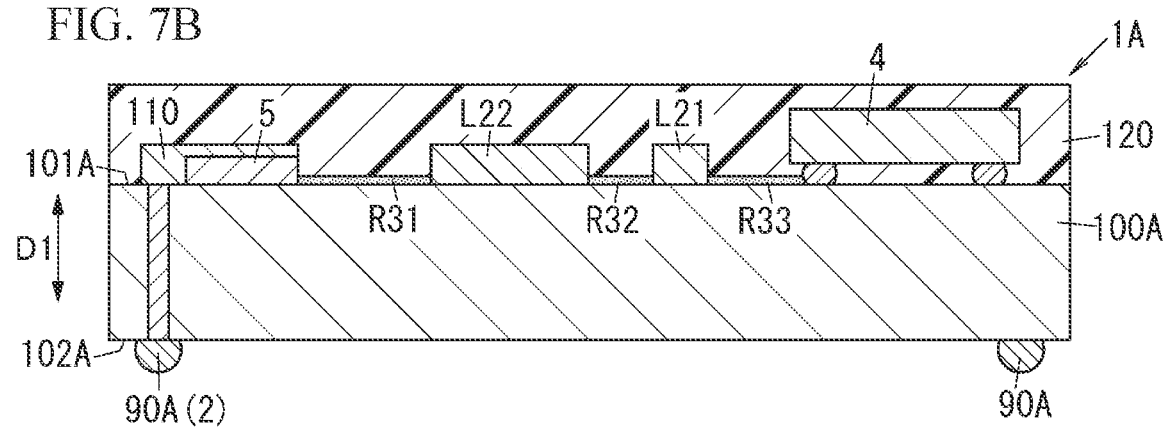

Multiple external connection electrodes 90A are disposed on a second main surface 102A opposed to the first main surface 101A in the first direction D1, which is the thickness direction of the mounting substrate 100A (refer to FIG. 7B). A radio-frequency module 1A is connected to a mother board on which the signal processing circuit 80 and so on are mounted with the multiple external connection electrodes 90A. The multiple external connection electrodes 90A are ball bumps each formed in a spherical shape. The material of the ball bumps is, for example, gold, copper, solder, or the like. The multiple external connection electrodes 90A include the antenna terminal 2 and the ground terminals used for grounding.

The antenna switch 5 in the switch IC 110 is connected to the second inductor L22 in the second phase adjustment circuit 7 with surface wiring, such as a conductor pattern. Specifically, the antenna switch 5 is connected to the second inductor L22 with a path R31 formed of the surface wiring, such as the conductor pattern (refer to FIG. 7A and FIG. 7B). The second inductor L22 and the first inductor L21 in the second phase adjustment circuit 7 are connected each other with surface wiring, such as a conductor pattern. Specifically, the second inductor L22 is connected to the first inductor L21 with a path R32 formed of the surface wiring, such as the conductor pattern (refer to FIG. 7A and FIG. 7B). The first inductor L21 is connected to the second reception filter 4 with surface wiring. Specifically, the first inductor L21 is connected to the second reception filter 4 with a path R33 formed of the surface wiring (refer to FIG. 7A and FIG. 7B).

The respective components provided on the first main surface 101A are electrically connected to the mounting substrate 100A with, for example, solder bumps. The solder bumps are disposed between the components that are disposed and the mounting substrate 100A in the thickness direction (the first direction D1) of the mounting substrate 100A. The second reception path R2 includes the paths R31, R32, and R33 described above.

Here, the path length of the path R31 between the antenna switch 5 and the second inductor L22 is denoted by "A11". Specifically, the length from the selection terminal 522 of the antenna switch 5 to one end of the second inductor L22, for example, the length of the path R31 is denoted by "A11".

In addition, the path length of the path R32 between the first inductor L21 and the second inductor L22 is denoted by "A12". Specifically, the length from the other end of the second inductor L22 to a node with the first inductor L21, for example, the length of the path R32 is denoted by "A12".

Furthermore, the path length of the path R33 between the first inductor L21 and the second reception filter 4 is denoted by "A13". Specifically, the length from the node with the first inductor L21 to the input terminal of the second reception filter 4, for example, the length of the path R33 is denoted by "A13".

The first inductor L21 and the second inductor L22 are disposed so that both an inequality "A11>A12" and an inequality "A11>A13" are established. The first inductor L21 and the second inductor L22 may be disposed so that one of the inequality "A11>A12" and the inequality "A11>A13" is established. In other words, it is sufficient for the first inductor L21 and the second inductor L22 to be disposed so that at least one of the inequality "A11>A12" and the inequality "A11>A13" is established.

(6.2) Second Modification

In the radio-frequency module 1 according to the first embodiment, the second resin layer 130 is provided so as to cover the switch IC 110 mounted on the second main surface 102 at the second main surface 102 side of the mounting substrate 100, as illustrated in FIG. 2B. In addition, the radio-frequency module 1 is provided with the multiple external connection electrodes 90 each formed in a cylindrical shape and is connected to the mother board with the multiple external connection electrodes 90.

Figure 8:
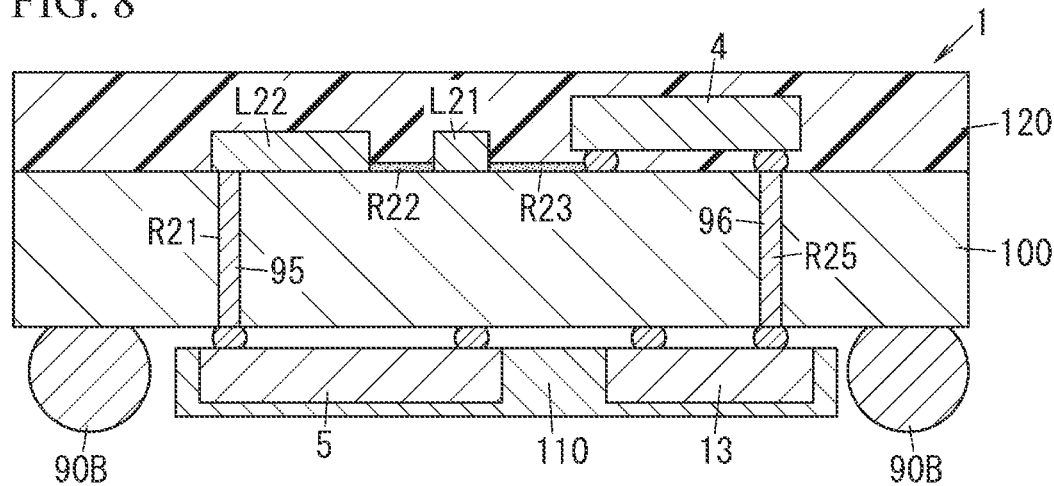
FIG. 8 is a cross-sectional view of a radio-frequency module according to a second modification of the first embodiment.

In contrast, as illustrated in FIG. 8, the second resin layer may be omitted at the second main surface 102 side of the mounting substrate 100 and the radio-frequency module 1 may be connected to the mother board with multiple external connection electrodes 90B each formed in a spherical shape.

The respective multiple external connection electrodes 90B are, for example, ball bumps each formed in a spherical shape. The material of the ball bumps is, for example, gold, copper, solder, or the like.

The radio-frequency module 1 may be provided with the multiple external connection electrodes 90 and the multiple external connection electrodes 90B.

(6.3) Third Modification

In the first embodiment, the first inductor L21 and the second inductor L22 are disposed so that both the first inequality "A1>A2" and the second inequality "A1>A3" are established for the path length "A1", the path length "A2", and the path length "A3". However, the first inductor L21 and the second inductor L22 are not limited to this configuration.

The path widths of the paths R21, R22, and R23 may be differentiated from each other. The paths R21, R22, and R23 may be formed so that both a third inequality "B1<B2" and a fourth inequality "B1<B3" are established where the path width of the path R21 is denoted by "B1", the path width of the path R22 is denoted by "B2", and the path width of the path R23 is denoted by "B3". The path width may be the average of the widths of the path, the maximum value thereof, or an intermediate value between the maximum value and the minimum value thereof.

Also in this case, the same advantage is achieved as in the case in which the path length "A1", the path length "A2", and the path length "A3" are different from each other.

The paths R21, R22, and R23 may be formed so that one of the third inequality and the fourth inequality is established. In other words, the paths R21, R22, and R23 may be formed so that at least one of the third inequality and the fourth inequality is established.

The relationship of the path length described in the first embodiment may be combined with the relationship of the path width in the present modification for the path R21, the path R22, and the path R23.

(6.4) Fourth Modification

Although the first reception filter 3 is configured to be a SAW filter in the first embodiment, the first reception filter 3 is not limited to this configuration. The first reception filter 3 may be another acoustic-wave filter, for example, an acoustic-wave filter using boundary acoustic waves, plate waves, or the likes. The first reception filter 3 may be, for example, a bulk acoustic wave (BAW) filter.

The second reception filter 4 may be another acoustic-wave filter, for example, an acoustic-wave filter using the boundary acoustic waves, the plate waves, or the likes, like the first reception filter 3. The second reception filter 4 may be, for example, a BAW filter.

(6.5) Fifth Modification

Although the mounting substrate 100 is configured to be a printed wiring board, an LTCC substrate, an HTCC substrate, or a resin substrate in the first embodiment, the mounting substrate 100 is not limited to this configuration. The mounting substrate 100 may be a component-embedded substrate.

(6.6) Sixth Modification

Although the antenna switch 5 and the multiple amplifiers 11 (the first low noise amplifier 12 and the second low noise amplifier 13) are configured to be included in the switch IC 110, that is, are configured to be formed into one chip in the first embodiment, the antenna switch 5 and the multiple amplifiers 11 are not limited to this configuration.

The antenna switch 5 and the multiple amplifiers 11 are not necessarily formed into one chip. The antenna switch 5 and the multiple amplifiers 11 may be separately disposed on the second main surface 102.

(6.7) Seventh Modification

Although each of the first inductor L21 and the second inductor L22 is a chip inductor as an example in the first embodiment, the first inductor L21 and the second inductor L22 are not limited to this configuration.

The first inductor L21 is not limited to the chip inductor and may be formed of a conductor pattern or the like. When the first inductor L21 is formed of a conductor pattern or the like, the first inductor L21 may be mounted in the mounting substrate 100.

Similarly, the second inductor L22 is not limited to the chip inductor and may be formed of a conductor pattern or the like. When the second inductor L22 is formed of a conductor pattern or the like, the second inductor L22 may be mounted in the mounting substrate 100.

(6.8) Eighth Modification

In the first embodiment, the radio-frequency module 1 may include a transmission filter, which is an acoustic-wave filter used for transmission of signals, instead of the first reception filter 3. In this case, a power amplifier is used, instead of the first low noise amplifier 12.

The radio-frequency module 1 may include a duplexer (acoustic-wave filter) used for transmission and reception of signals, instead of the first reception filter 3. In this case, the first low noise amplifier 12 and the power amplifier are connected to the duplexer.

In addition, the radio-frequency module 1 may include a duplexer (acoustic-wave filter) used for transmission and reception of signals, instead of the second reception filter 4. In this case, the second low noise amplifier 13 and the power amplifier are connected to the duplexer.

Second Embodiment

The present embodiment differs from the first embodiment in that a radio-frequency module 1B includes a phase adjustment circuit 7b, instead of the second phase adjustment circuit 7, and does not include the first phase adjustment circuit 6.

Points different from the first embodiment will be described here. The same reference numerals and letters are added to the same components as in the first embodiment and a description of such components is appropriately omitted herein.

(1) Configuration

Figure 9:
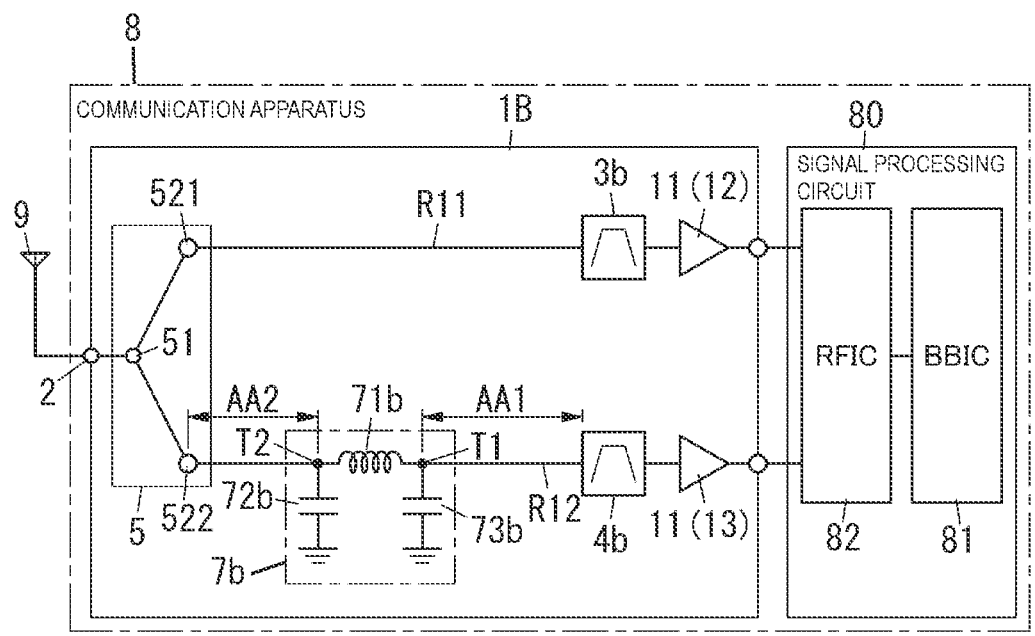
FIG. 9 is a schematic configuration diagram of a radio-frequency module according to a second embodiment and a communication apparatus including the radio-frequency module.

The communication apparatus 8 of the present embodiment includes the radio-frequency module 1B and the signal processing circuit 80, as illustrated in FIG. 9.

Figure 10A:
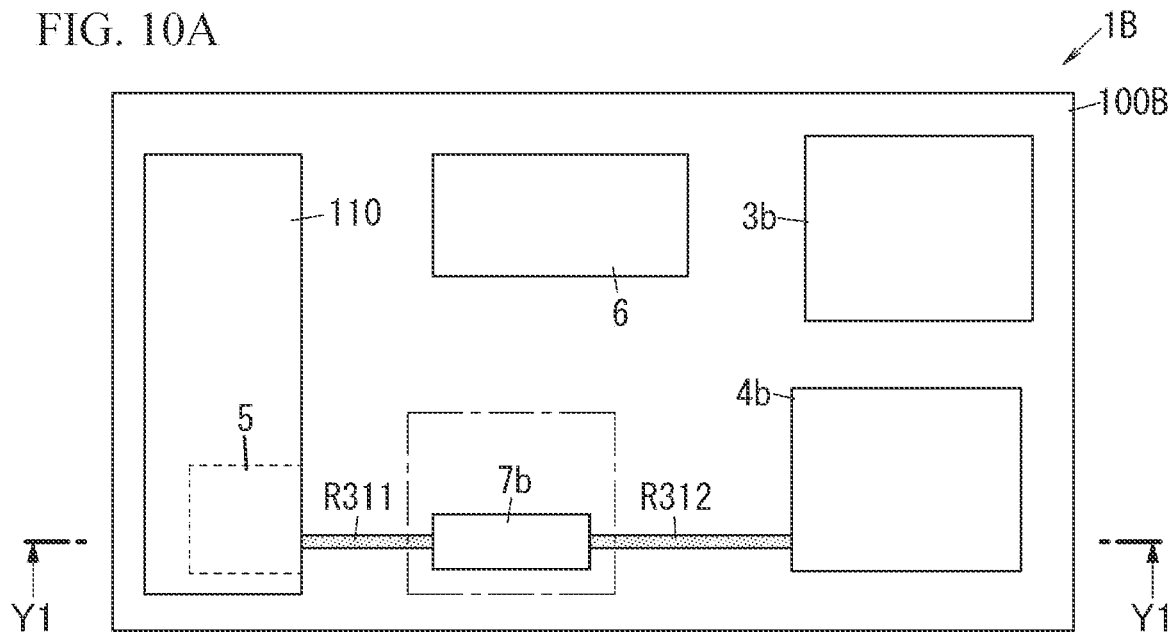
FIG. 10A is a plan view of the radio-frequency module in FIG. 9
Figure 10B:
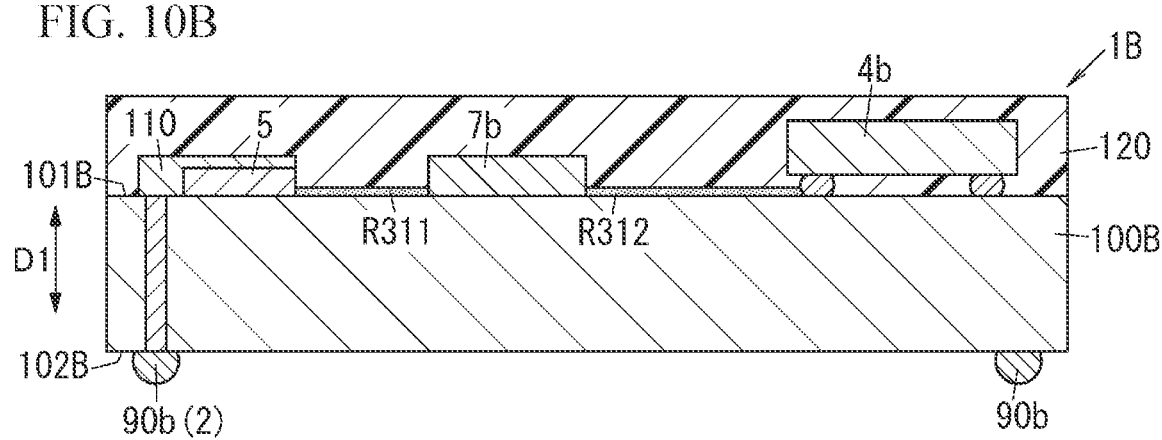
FIG. 10B is a cross-sectional view of the radio-frequency module in FIG. 9 taken along a Y1-Y1 line.

The radio-frequency module 1B according to the present embodiment includes the antenna terminal 2, a first reception filter 3b, a second reception filter 4b, the antenna switch 5 (the switch), and the phase adjustment circuit 7b, as illustrated in FIG. 9. The radio-frequency module 1B also includes the first low noise amplifier 12 and the second low noise amplifier 13 as the amplifiers 11 that amplify signals. The radio-frequency module 1B further includes a mounting substrate 100B, as illustrated in FIG. 10A and FIG. 10B.

The first reception filter 3b is an acoustic-wave filter. The acoustic-wave filter is, for example, a SAW filter using the surface acoustic waves.

The first reception filter 3b is provided on a first reception path R11 (a first communication band path) used for receiving the first reception signal from the antenna 9, as illustrated in FIG. 9. In other words, the first reception path R11 is a signal path with which the antenna switch 5 is connected to the first reception filter 3b and is a path used for receiving the first reception signal through the antenna terminal 2.

The first reception filter 3b is an acoustic-wave filter using the first communication band as the passband. In other words, the first reception filter 3b is an acoustic-wave filter that transmits a signal in the first communication band. Specifically, the first reception filter 3b transmits the first reception signal in the first frequency band included in the first communication band. Here, the first communication band is, for example, Band41 (reception band: 2,496 MHz to 2,690 MHz) in the LTE standards.

The second reception filter 4b is an acoustic-wave filter. The acoustic-wave filter is, for example, a SAW filter using the surface acoustic waves.

The second reception filter 4b is provided on a second reception path R12 (the signal path) used for receiving the second reception signal from the antenna 9, as illustrated in FIG. 9. In other words, the second reception path R12 is a signal path with which the antenna switch 5 is connected to the second reception filter 4b and is a path used for receiving the second reception signal through the antenna terminal 2.

The second reception filter 4b is an acoustic-wave filter using the second communication band as the passband. In other words, the second reception filter 4b is an acoustic-wave filter that transmits a signal in the second communication band. Specifically, the second reception filter 4b transmits the second reception signal in the second frequency band included in the second communication band. Here, the second frequency band is a frequency band lower than the first frequency band. Here, the second communication band is, for example, Band3 (reception band: 1,805 MHz to 1,880 MHz) in the LTE standards (including the LTE-Advanced standards). In other words, the second reception filter 4b is a filter that transmits a signal in the second communication band, which is a frequency band lower than the frequency band of the first communication band. Here, the passband of the second reception filter 4b is not overlapped with the passband of the first reception filter 3b.

The phase adjustment circuit 7b is provided on the second reception path R12. The phase adjustment circuit 7b includes an inductor 71b, a first capacitor 72b, and a second capacitor 73b. The inductor 71b is inserted in series onto the second reception path R12. The first capacitor 72b is provided between a first end T2 of the inductor 71b and the ground. The second capacitor 73b is provided between a second end T1 of the inductor 71b and the ground. In other words, the phase adjustment circuit 7b is a π-shaped circuit. Here, the first end T2 of the inductor 71b is an end portion at the antenna switch 5 side, among both ends of the inductor 71b. The second end T1 of the inductor 71b is an end portion at the second reception filter 4b side, among both ends of the inductor 71b.

The mounting substrate 100B has a first main surface 101B and a second main surface 102B that are opposed to each other in the first direction D1, which is the thickness direction of the mounting substrate 100B, as illustrated in FIG. 10B. The mounting substrate 100B is, for example, a printed wiring board, LTCC substrate, HTCC substrate, or a resin substrate. Here, the mounting substrate 100B is, for example, a multilayer substrate including multiple dielectric layers and multiple conductive layers. The multiple dielectric layers and the multiple conductive layers are laminated in the first direction D1 of the mounting substrate 100B. The multiple conductive layers are formed in predetermined patterns defined for the respective layers. Each of the multiple conductive layers includes one or more conductor portions in one plane surface orthogonal to the first direction D1 of the mounting substrate 100B. The material of the respective conductive layers is, for example, copper. The multiple conductive layers include the ground layer. In the radio-frequency module 1B, the multiple ground terminals and the ground layer are electrically connected to each other via a via conductor and so on in the mounting substrate 100B.

The mounting substrate 100B is not limited to the printed wiring board and the LTCC substrate and may be a wiring structure. The wiring structure is, for example, a multilayer structure. The multilayer structure includes at least one insulating layer and at least one conductive layer. The insulating layer is formed in a predetermined pattern. When the multiple insulating layers are provided, the multiple insulating layers are formed in predetermined patterns defined for the respective layers. The conductive layer is formed in a predetermined pattern different from that of the insulating layer. When the multiple conductive layers are provided, the multiple conductive layers are formed in predetermined patterns defined for the respective layers. The conductive layer may include one or more rewiring portions. In the wiring structure, a first surface, among the two surfaces opposed to each other in the thickness direction of the multilayer structure, is the first main surface 101B of the mounting substrate 100B and a second surface, among the two surfaces opposed to each other in the thickness direction of the multilayer structure, is the second main surface 102B of the mounting substrate 100B. The wiring structure may be, for example, an interposer. The interposer may be an interposer using a silicon substrate or a substrate composed of multiple layers.

The first reception filter 3b, the second reception filter 4b, and the phase adjustment circuit 7b are mounted on the first main surface 101B (refer to FIG. 10A and FIG. 10B). The switch IC 110 including the antenna switch 5 is further mounted on the first main surface 101B (refer to FIG. 10B). The switch IC 110 includes the multiple amplifiers 11 (the first low noise amplifier 12 and the second low noise amplifier 13), as in the first embodiment.

The phase adjustment circuit 7*b* and the antenna switch 5 are connected to each other with surface wiring, such as a conductor pattern. Specifically, the phase adjustment circuit 7*b* is connected to the antenna switch 5 with a path R311 formed of the surface wiring (refer to FIG. 10B). Here, the surface wiring is a wiring conductor provided on the first main surface 101B of the mounting substrate 100B.

The phase adjustment circuit 7*b* and the second reception filter 4*b* are connected to each other with surface wiring, such as a conductor pattern. Specifically, the phase adjustment circuit 7*b* is connected to the second reception filter 4*b* with a path R312 formed of the surface wiring (refer to FIG. 10B). Here, the path R312 can have low impedance, which is lower than or equal to 50Ω.

Part of the first reception filter 3*b* may be mounted on the first main surface 101B of the mounting substrate 100B and the remaining portion of the first reception filter 3*b* may be mounted in the mounting substrate 100B. In other words, the first reception filter 3*b* is disposed at the first main surface 101B side with respect to the second main surface 102B of the mounting substrate 100B and at least includes the portion mounted on the first main surface 101B.

Part of the second reception filter 4*b* may be mounted on the first main surface 101B of the mounting substrate 100B and the remaining portion of the second reception filter 4*b* may be mounted in the mounting substrate 100B. In other words, the second reception filter 4*b* is disposed at the first main surface 101B side with respect to the second main surface 102B of the mounting substrate 100B and at least includes the portion mounted on the first main surface 101B.

Part of the phase adjustment circuit 7*b* may be mounted on the first main surface 101B of the mounting substrate 100B and the remaining portion of the phase adjustment circuit 7*b* may be mounted in the mounting substrate 100B. In other words, the phase adjustment circuit 7*b* is disposed at the first main surface 101B side with respect to the second main surface 102B of the mounting substrate 100B and at least includes the portion mounted on the first main surface 101B. For example, the inductor 71*b* may be mounted on the first main surface 101B and the first capacitor 72*b* and the second capacitor 73*b* may be mounted in the mounting substrate 100B. In this case, the inductor 71*b*, the first capacitor 72*b*, and the second capacitor 73*b* are connected with each other with a path formed of an inner wiring conductor that is composed of a wiring conductor and a via conductor, which are provided in the mounting substrate 100B.

Part of the switch IC 110 may be mounted on the first main surface 101B of the mounting substrate 100B and the remaining portion of the switch IC 110 may be mounted in the mounting substrate 100B. In other words, the switch IC 110 is disposed at the first main surface 101B side with respect to the second main surface 102B of the mounting substrate 100B and at least includes the portion mounted on the first main surface 101B.

The respective components provided on the first main surface 101B are electrically connected to the mounting substrate 100B with, for example, solder bumps. The solder bumps are disposed between the components that are disposed and the mounting substrate 100B in the thickness direction (the first direction D1) of the mounting substrate 100B. The second reception path R12 described above includes the paths R311 and R312 described above.

Other components in the radio-frequency module 1B will now be described.

FIG. 10A is a plan view when the radio-frequency module 1B is viewed from the first direction D1. FIG. 10B is a cross-sectional view of the radio-frequency module 1B.

The radio-frequency module 1B is provided with multiple external connection electrodes 90*b* (refer to FIG. 10B). The radio-frequency module 1B is connected to a mother board on which the signal processing circuit 80 and so on are mounted with the multiple external connection electrodes 90*b*. The multiple external connection electrodes 90*b* are ball bumps each formed in a spherical shape. The material of the ball bumps is, for example, gold, copper, solder, or the like. The multiple external connection electrodes 90*b* include the antenna terminal 2 and the ground terminals used for grounding.

The radio-frequency module 1B accepts a signal received through the antenna 9 via the antenna terminal 2, which is one external connection electrode 90*b* in the multiple external connection electrodes 90*b*, and supplies the signal to the signal processing circuit 80 via another external connection electrode 90*b*.

The radio-frequency module 1B further includes the first resin layer 120 on the first main surface 101B of the mounting substrate 100B. Electronic components including the first reception filter 3*b*, the second reception filter 4*b*, the phase adjustment circuit 7*b*, and the switch IC 110, which are mounted on the first main surface 101B, are covered with the first resin layer 120. The first resin layer 120 is omitted in FIG. 10A.

The first capacitor 72*b*, the inductor 71*b*, and the second capacitor 73*b* in the phase adjustment circuit 7*b* and the second reception filter 4*b* are disposed in this order along the second direction D2 orthogonal to the first direction D1 (refer to FIG. 9). The phase adjustment circuit 7*b* is connected to the antenna switch 5 via the path R311 included in the second reception path R12 (refer to FIG. 10B).

Here, the path length between the antenna switch 5 and the phase adjustment circuit 7*b* on the second reception path R12 is denoted by "AA2". Specifically, on the second reception path R12, the length from the selection terminal 522 of the antenna switch 5 to a node between the first capacitor 72*b* and the inductor 71*b*, for example, the length of the path R311 (refer to FIG. 10A and FIG. 10B) is denoted by "AA2" (refer to FIG. 9). Here, the node between the first capacitor 72*b* and the inductor 71*b* corresponds to the first end T2 of the inductor 71*b*. The node between the first capacitor 72*b* and the inductor 71*b* may be referred to as a node T2 in the following description.

The path length between the second reception filter 4*b* and the second capacitor 73*b* is denoted by "AA1". Specifically, on the second reception path R12, the length from a node between the inductor 71*b* and the second capacitor 73*b* to an input terminal of the second reception filter 4*b*, for example, the length of the path R312 (refer to FIG. 10A and FIG. 10B) is denoted by "AA1" (refer to FIG. 9). Here, the node between the second capacitor 73*b* and the inductor 71*b* corresponds to the second end T1 of the inductor 71*b*. The node between the second capacitor 73*b* and the inductor 71*b* may be referred to as a node T1 in the following description.

The path length between the second reception filter 4*b* and the second capacitor 73*b* is also referred to as a first path length. The path length between the antenna switch 5 and the phase adjustment circuit 7*b* is also referred to as a second path length.

The switch IC 110, the phase adjustment circuit 7*b*, and the second reception filter 4*b* are disposed so that a first inequality "AA1>AA2" is established. The first path length "AA1" is longer than the second path length "AA2" in the second embodiment.

Since the operation of the radio-frequency module 1B according to the second embodiment is the same as that of the radio-frequency module 1 according to the first embodiment, a description of the operation of the radio-frequency module 1B is omitted herein.

(2) Advantages

As described above, the radio-frequency module 1B of the second embodiment includes the first acoustic-wave filter (for example, the first reception filter 3b), the second acoustic-wave filter (for example, the second reception filter 4b), the switch (for example, the antenna switch 5), and the phase adjustment circuit 7b. The first acoustic-wave filter transmits the signal in the first communication band. The second acoustic-wave filter transmits the signal in the second communication band, which is a frequency band lower than the frequency band of the first communication band. The switch is capable of simultaneously connecting the first acoustic-wave filter and the second acoustic-wave filter to the antenna terminal 2. The phase adjustment circuit 7b is provided on the signal path (for example, the second reception path R12) with which the switch is connected to the second acoustic-wave filter and adjusts the phase of the signal in the second communication band. The phase adjustment circuit 7b includes the inductor 71b, the first capacitor 72b, and the second capacitor 73b. The inductor 71b is connected in series between the switch and the second acoustic-wave filter on the signal path. The first capacitor 72b is provided between the first end T2 at the switch side, among both ends of the inductor 71b, and the ground on the signal path. The second capacitor (73b) is provided between the second end T1 at the second acoustic-wave filter side, among both ends of the inductor 71b, and the ground on the signal path. The length (the first path length "AA1") of a first path (for example, the path R312) between the node between the inductor 71b and the second capacitor 73b (the second end T1 of the inductor 71b) and the second acoustic-wave filter on the signal path is longer than the length (the second path length "AA2") of a second path (for example, the path R311) between the node between the inductor 71b and first capacitor 72b (the first end T2 of the inductor 71b) and the switch on the signal path.

When the communication is performed in which the first communication band and the second communication band are simultaneously used, it is suitable to design the radio-frequency module so that the frequency band of the first reception filter 3b when the second reception filter 4b side is viewed from the antenna switch 5 is made open. In addition, when the communication is performed in which the first communication band and the second communication band are simultaneously used, it is suitable to make the frequency band of another filter (for example, the first reception filter 3b) open in one filter (for example, the second reception filter 4b) and to make return loss in the frequency band of the other filter (for example, the first reception filter 3b) large.

Figure 11:
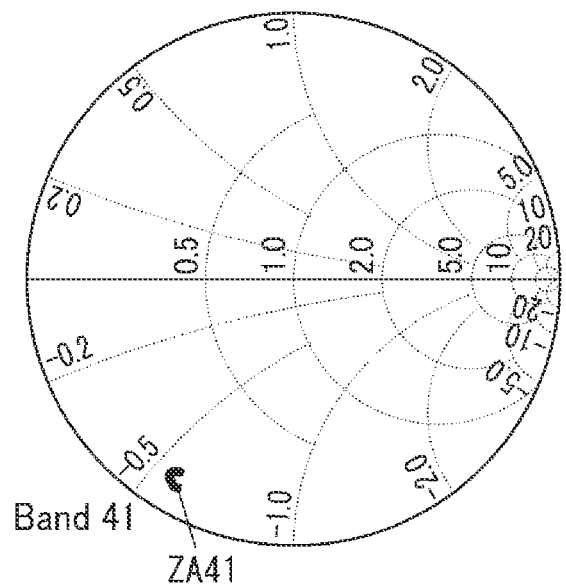
FIG. 11 is a Smith chart indicating the impedance of the second reception filter in a frequency band of the first communication band when the second reception filter is viewed from the antenna switch in the radio-frequency module in FIG. 9.

Referring to FIG. 11, ZA41 indicates the impedance of the second reception filter 4b in the frequency band of the first communication band when the second reception filter 4b side is viewed from the selection terminal 522 in the communication in which the first communication band and the second communication band are simultaneously used. Here, the impedance of the second reception filter 4b in the first communication band is the capacitive impedance. In this case, although the capacitance occurs between the ground layer of the mounting substrate 100B and the second reception path R12 between the antenna switch 5 and the second reception filter 4b, the return loss is not decreased. Accordingly, it is possible to lengthen the second reception path R12.

Figure 12:
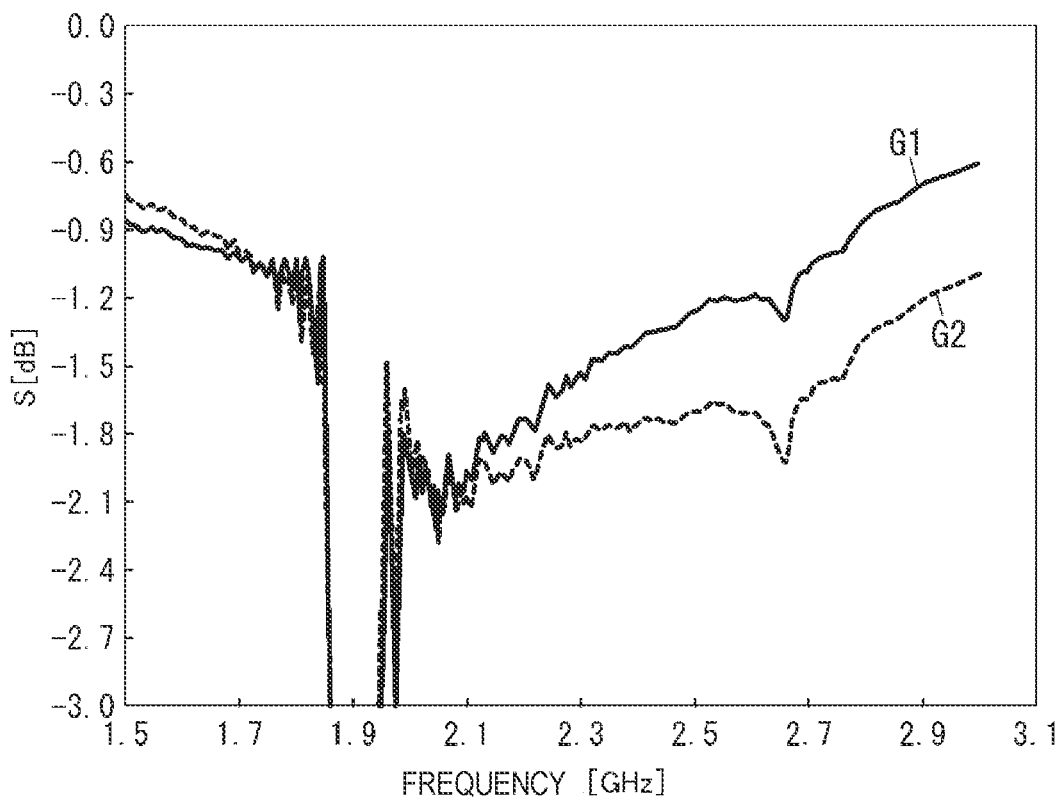
FIG. 12 is a graph indicating return loss in communication in which the first communication band and the second communication band are simultaneously used.
Figure 13:
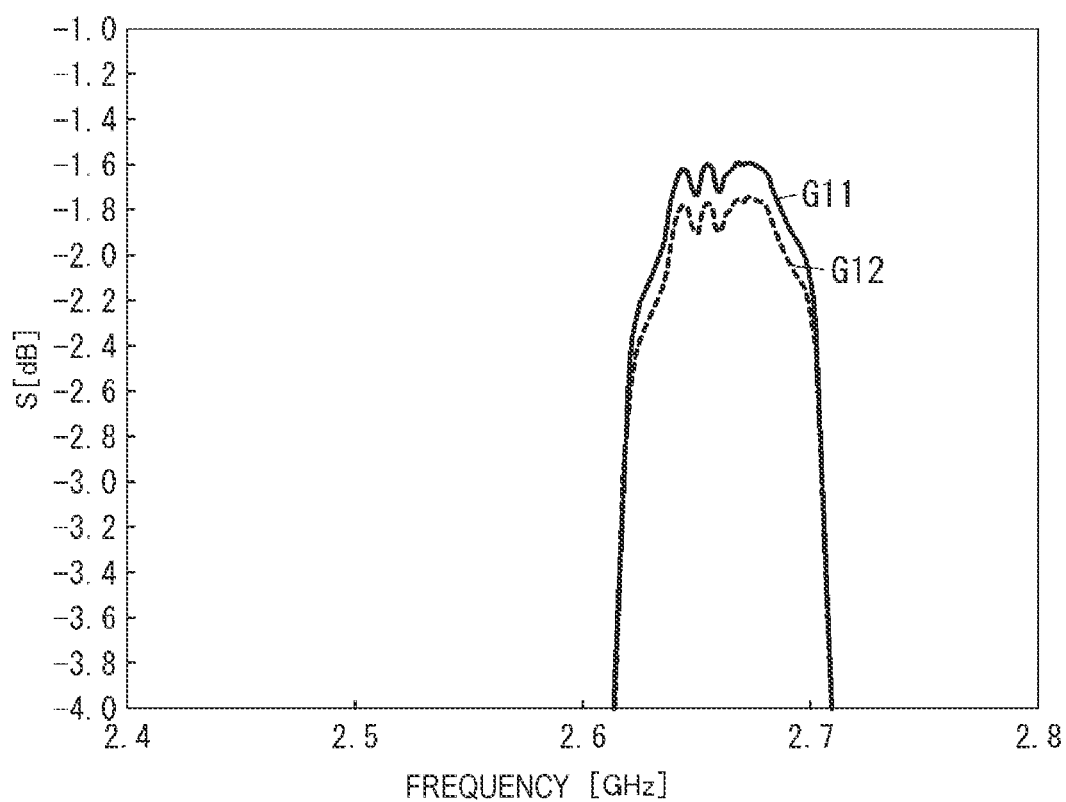
FIG. 13 is a graph indicating loss of a signal in the frequency band of the first communication band when the second reception filter side is viewed from a selection terminal.

FIG. 12 indicates the return loss in the communication in which the first communication band and the second communication band are simultaneously used. Referring to the graph in FIG. 12, the horizontal axis represents frequency and the vertical axis represents RL. FIG. 13 indicates the loss of the signal in the frequency band of the first communication band when the second reception filter 4b side is viewed from the selection terminal 522 in the communication in which the first communication band and the second communication band are simultaneously used. Referring to the graph in FIG. 13, the horizontal axis represents frequency and the vertical axis represents IL. A characteristic G1 indicated in FIG. 12 and a characteristic G11 indicated in FIG. 13 indicate the return loss and the loss, respectively, when the first path length "AA1" of the path R312 is made longer than the second path length "AA2" of the path R311. A characteristic G2 indicated in FIG. 12 and a characteristic G12 indicated in FIG. 13 indicates the return loss and the loss, respectively, when the second path length "AA2" of the path R311 is made longer than the first path length "AA1" of the path R312. FIG. 12 and FIG. 13 indicate that, when the path R312 is made longer than the path R311, the return loss of the signal in the frequency band of the first communication band (Band 41 here) is increased when the second reception filter 4 side is viewed from the selection terminal 522.

Accordingly, it is possible to achieve more excellent impedance characteristics.

(3) Modifications

Modifications of the second embodiment will now be described.

(3.1) First Modification

A mounting substrate 100C of a first modification differs from the second embodiment in that the switch IC 110 is mounted on the second main surface 102B. Points different from the second embodiment will be described here. The same reference numerals and letters are added to the same components as in the second embodiment and a description of such components is appropriately omitted herein.

A radio-frequency module 1C according to the first modification includes the antenna terminal 2, the first reception filter 3b, the second reception filter 4b, the antenna switch 5, and the phase adjustment circuit 7b, as in the second embodiment. The radio-frequency module 1C also includes the first low noise amplifier 12 and the second low noise amplifier 13. The radio-frequency module 1C further includes the mounting substrate 100C, as illustrated in FIG. 14A and FIG. 14B.

Figure 14A:
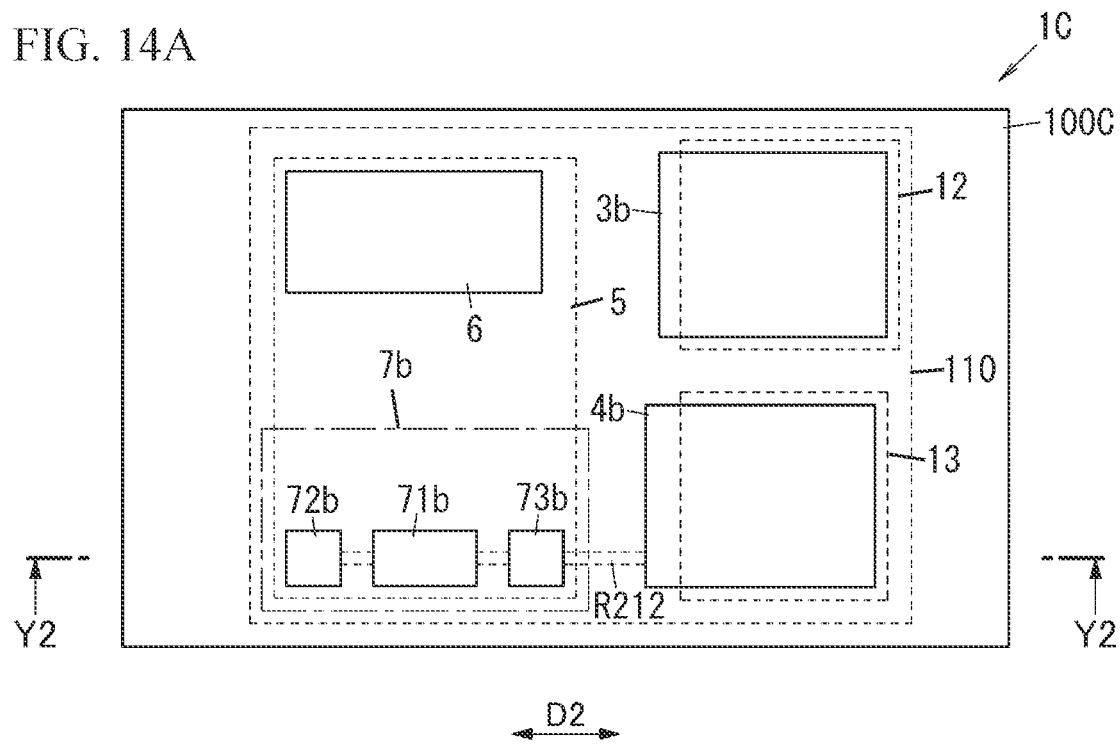
FIG. 14A is a plan view of a radio-frequency module according to a first modification of the second embodiment and FIG. 14B is a cross-sectional view of the radio-frequency module in FIG. 14A taken along a Y2-Y2 line.

FIG. 14A is a plan view when the radio-frequency module 1C according to the first modification is viewed from the first direction D1. FIG. 14B is a cross-sectional view of the radio-frequency module 1C.

Figure 14B:
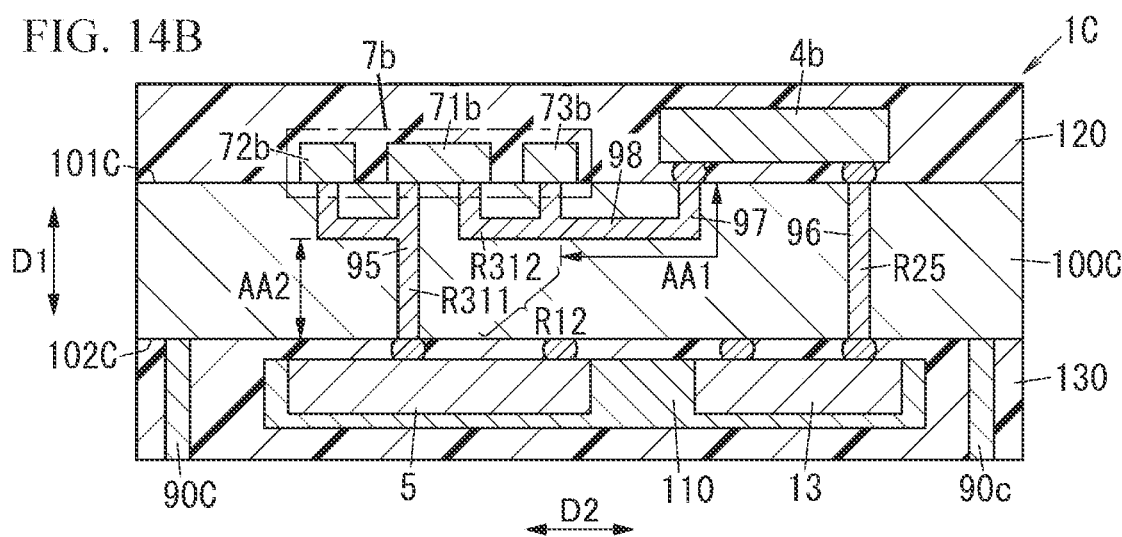

The radio-frequency module 1C is provided with multiple external connection electrodes 90c (refer to FIG. 14B). The radio-frequency module 1C is connected to a mother board on which the signal processing circuit 80 and so on are mounted with the multiple external connection electrodes 90c. The multiple external connection electrodes 90c are columnar (for example, cylindrical) electrodes disposed (provided) on the second main surface 102C of the mounting substrate 100C. The material of the multiple external connection electrodes 90c is, for example, metal (for example, copper, copper alloy, or the like). The multiple external connection electrodes 90c include the antenna terminal 2 and the ground terminals used for grounding.

The radio-frequency module 1C accepts a signal received through the antenna 9 via the antenna terminal 2, which is one external connection electrode 90c in the multiple external connection electrodes 90c, and supplies the signal to the signal processing circuit 80 via another external connection electrode 90c.

The first reception filter 3b, the second reception filter 4b, and the phase adjustment circuit 7b are mounted on a first main surface 101C of the mounting substrate 100C. The switch IC 110 is mounted on a second main surface 102C of the mounting substrate 100C.

The radio-frequency module 1C further includes the resin layer 120 (hereinafter also referred to as the first resin layer 120) on the first main surface 101C of the mounting substrate 100C. Electronic components including the first reception filter 3b, the second reception filter 4b, and the phase adjustment circuit 7b, which are mounted on the first main surface 101C, are covered with the first resin layer 120. The radio-frequency module 1C further includes the second resin layer 130 on the second main surface 102C of the mounting substrate 100C. Electronic components including the switch IC 110 mounted on the second main surface 102C are covered with the second resin layer 130. The material of the second resin layer 130 may be the same as that of the first resin layer 120 or may be different from that of the first resin layer 120. The first resin layer 120 is omitted in FIG. 14A.

The antenna switch 5, the first low noise amplifier 12, the second low noise amplifier 13 are disposed on the second main surface 102C of the mounting substrate 100C, as described above (refer to FIG. 14A and FIG. 14B).

The phase adjustment circuit 7b, the first reception filter 3b, and the second reception filter 4b are disposed on the first main surface 101C of the mounting substrate 100C (refer to FIG. 14A and FIG. 14B).

The first capacitor 72b, the inductor 71b, and the second capacitor 73b in the phase adjustment circuit 7b and the second reception filter 4b are disposed in this order along the second direction D2. The first capacitor 72b and the inductor 71b are connected to the antenna switch 5 via the path R311 included in the second reception path R12 (refer to FIG. 14B). The second reception filter 4b is connected to the second low noise amplifier 13 via the path R25 (refer to FIG. 14B).

In the first modification, in a plan view of the mounting substrate 100C, that is, when the mounting substrate 100C is viewed from the first direction D1, the phase adjustment circuit 7b is overlapped with the antenna switch 5 (refer to FIG. 14A and FIG. 14B). In a plan view of the mounting substrate 100C, part of the phase adjustment circuit 7b may be overlapped with the antenna switch 5. In other words, in a plan view of the mounting substrate 100C, it is sufficient for at least part of the phase adjustment circuit 7b to be overlapped with the antenna switch 5.

In the first modification, in a plan view of the mounting substrate 100C, the first capacitor 72b is overlapped with the antenna switch 5 (refer to FIG. 14A and FIG. 14B). In a plan view of the mounting substrate 100C, part of the first capacitor 72b may be overlapped with the antenna switch 5. In other words, in a plan view of the mounting substrate 100C, it is sufficient for at least part of the first capacitor 72b to be overlapped with the antenna switch 5.

In the first modification, in a plan view of the mounting substrate 100C, the inductor 71b is overlapped with the antenna switch 5 (refer to FIG. 14A and FIG. 14B). In a plan view of the mounting substrate 100C, part of the inductor 71b may be overlapped with the antenna switch 5. In other words, in a plan view of the mounting substrate 100C, it is sufficient for at least part of the inductor 71b to be overlapped with the antenna switch 5.

In the first modification, in a plan view of the mounting substrate 100C, the second capacitor 73b is overlapped with the antenna switch 5 (refer to FIG. 14A and FIG. 14B). In a plan view of the mounting substrate 100C, part of the second capacitor 73b may be overlapped with the antenna switch 5. In other words, in a plan view of the mounting substrate 100C, it is sufficient for at least part of the second capacitor 73b to be overlapped with the antenna switch 5.

In a plan view of the mounting substrate 100C, at least part of the first reception filter 3b is overlapped with the first low noise amplifier 12 (refer to FIG. 14A).

In a plan view of the mounting substrate 100C, at least part of the second reception filter 4b is overlapped with the second low noise amplifier 13 (refer to FIG. 14A and FIG. 14B).

The antenna switch 5 is connected to the phase adjustment circuit 7b via the via conductor 95 and an inner wiring conductor, which are provided in the mounting substrate 100C. Here, the via conductor 95 included in the path between the antenna switch 5 and the phase adjustment circuit 7b forms the path R311. The phase adjustment circuit 7b is connected to the second reception filter 4b via a wiring conductor 98 and a via conductor 97. Here, the wiring conductor 98 and the via conductor 97 included in the path between the phase adjustment circuit 7b and the second reception filter 4b form the path R312.

In the first modification, the second reception path R12 from the antenna switch 5 to the second reception filter 4b includes the path R311 and the path R312. In the first modification, the path length of the path R311 in the second reception path R12 corresponds to the second path length "AA2" and the path length of the path R312 in the second reception path R12 corresponds to the first path length "AA1". In other words, in the first modification, the path length of the path R312 is longer than the path length of the path R311.

Also in the first modification, it is possible to achieve more excellent impedance characteristics, as in the second embodiment.

Another modification of the first modification will now be described.

In the radio-frequency module 1C according to the first modification of the second embodiment, the second resin layer 130 is provided at the second main surface 102C side of the mounting substrate 100C so as to cover the switch IC 110 mounted on the second main surface 102C, as illustrated in FIG. 14B. In addition, the radio-frequency module 1C is provided with the multiple external connection electrodes 90c each formed in a cylindrical shape and is connected to the mother board with the multiple external connection electrodes 90c.

Figure 15:
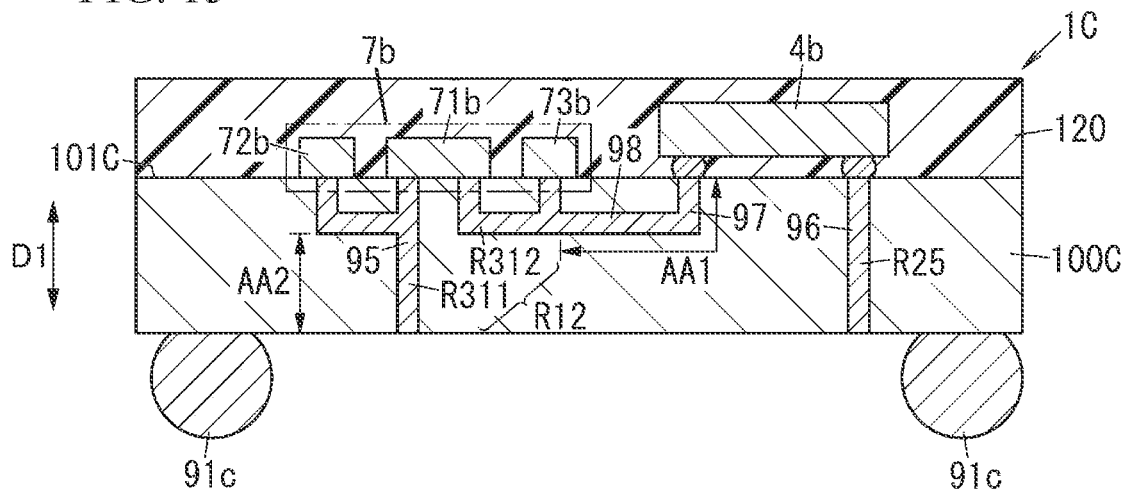
FIG. 15 is a cross-sectional view of a radio-frequency module according to another modification of the first modification of the second embodiment.

In contrast, as illustrated in FIG. 15, the second resin layer may be omitted at the second main surface 102C side of the mounting substrate 100C and the radio-frequency module 1C may be connected to the mother board with multiple external connection electrodes 91c each formed in a spherical shape.

The respective multiple external connection electrodes 91c are, for example, ball bumps each formed in a spherical shape. The material of the ball bumps is, for example, gold, copper, solder, or the like.

The radio-frequency module 1C may be provided with the multiple external connection electrodes 90c and the multiple external connection electrodes 91c.

(3.2) Second Modification

A second modification differs from the second embodiment in that a phase adjustment circuit is also provided on the first reception path R11. Points different from the second embodiment will be described here. The same reference numerals and letters are added to the same components as in the second embodiment and a description of such components is appropriately omitted herein.

Figure 16:
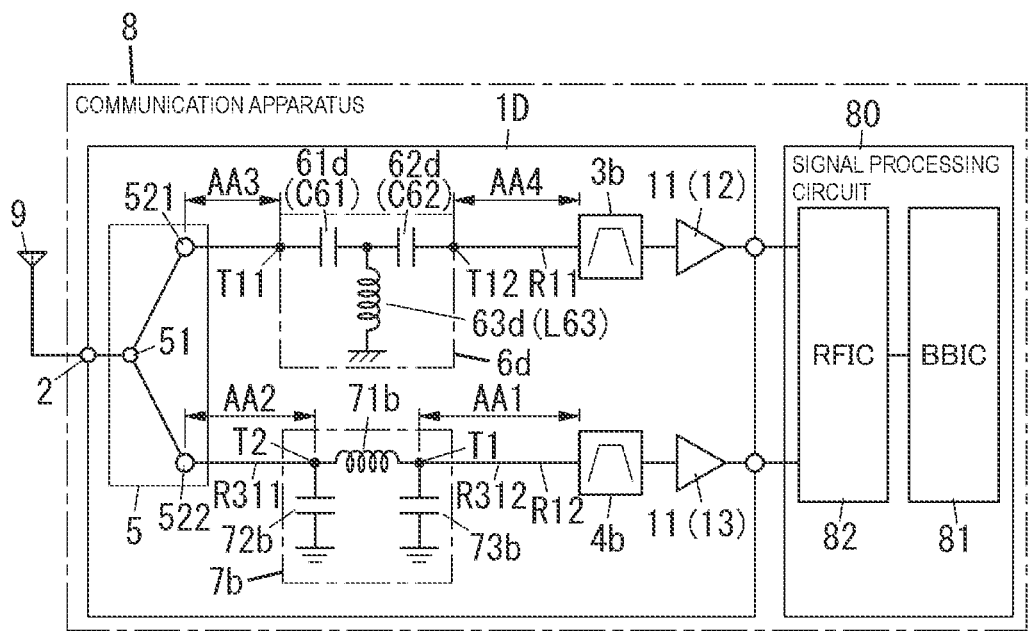
FIG. 16 is a schematic configuration diagram of a radio-frequency module according to a second modification of the second embodiment and a communication apparatus including the radio-frequency module.
Figure 17:
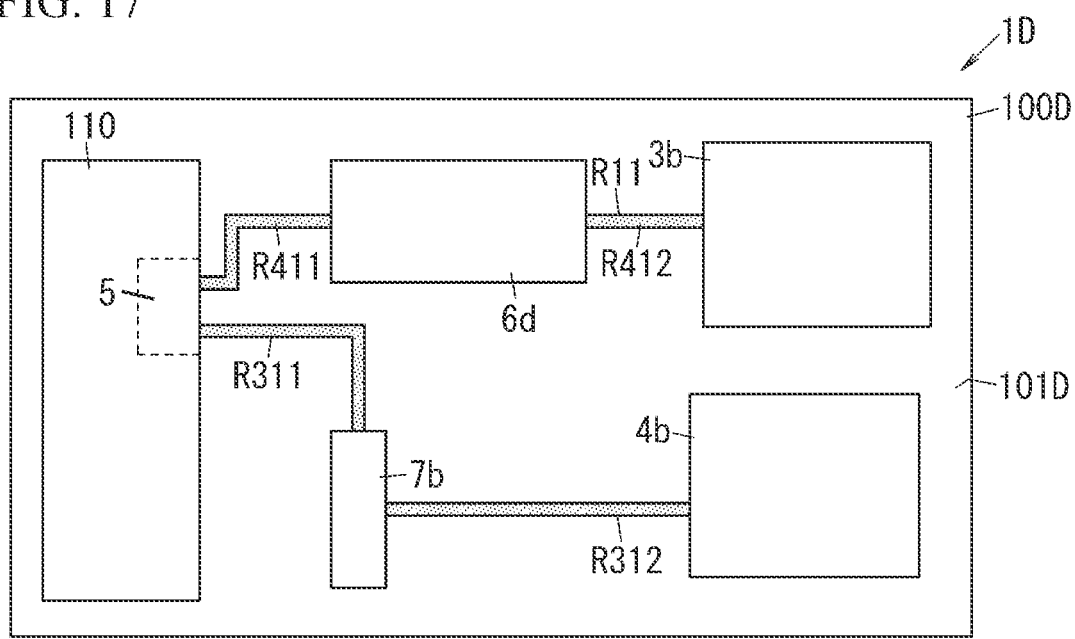
FIG. 17 is a plan view of the radio-frequency module in FIG. 16.

A radio-frequency module 1D according to the second modification includes the antenna terminal 2, the first reception filter 3b, the second reception filter 4b, the antenna switch 5, a first phase adjustment circuit 6d, and the phase adjustment circuit 7b (hereinafter referred to as a second phase adjustment circuit 7b), as illustrated in FIG. 16. The radio-frequency module 1D also includes the first low noise amplifier 12 and the second low noise amplifier 13. The radio-frequency module 1D further includes a mounting substrate 100D, as illustrated in FIG. 17.

The first phase adjustment circuit 6d is a high pass filter (HPF) phase circuit and includes a first reactance element 61d, a second reactance element 62d, and a third reactance element 63d, as illustrated in FIG. 16. The first phase adjustment circuit 6d includes a capacitor C61 as the first reactance element 61d, includes a capacitor C62 as the second reactance element 62d, and includes an inductor L63 as the third reactance element 63d.

The first reactance element 61d and the second reactance element 62d are inserted in series onto the first reception path R11 between the antenna switch 5 and the first reception filter 3b. In the second modification, the first reactance element 61d is disposed between the antenna switch 5 and the second reactance element 62d on the first reception path R11.

The third reactance element 63d is provided between one point between the first reactance element 61d and the second reactance element 62d and the ground. In other words, one end of the third reactance element 63d is connected between the first reactance element 61d and the second reactance element 62d and the other end thereof is grounded.

The mounting substrate 100D has a first main surface 101D and a second main surface that are opposed to each other in the thickness direction (corresponding to the first direction D1) of the mounting substrate 100D. The mounting substrate 100D is, for example, a printed wiring board, LTCC substrate, HTCC substrate, or a resin substrate. Here, the mounting substrate 100D is, for example, a multilayer substrate including multiple dielectric layers and multiple conductive layers. The multiple dielectric layers and the multiple conductive layers are laminated in the thickness direction of the mounting substrate 100D. The multiple conductive layers are formed in predetermined patterns defined for the respective layers. Each of the multiple conductive layers includes one or more conductor portions in one plane surface orthogonal to the thickness direction of the mounting substrate 100D. The material of the respective conductive layers is, for example, copper. The multiple conductive layers include the ground layer. In the radio-frequency module 1D, the multiple ground terminals and the ground layer are electrically connected to each other via a via conductor and so on in the mounting substrate 100D.

The mounting substrate 100D is not limited to the printed wiring board and the LTCC substrate and may be a wiring structure. The wiring structure is, for example, a multilayer structure. The multilayer structure includes at least one insulating layer and at least one conductive layer. The insulating layer is formed in a predetermined pattern. When the multiple insulating layers are provided, the multiple insulating layers are formed in predetermined patterns defined for the respective layers. The conductive layer is formed in a predetermined pattern different from that of the insulating layer. When the multiple conductive layers are provided, the multiple conductive layers are formed in predetermined patterns defined for the respective layers. The conductive layer may include one or more rewiring portions. In the wiring structure, a first surface, among the two surfaces opposed to each other in the thickness direction of the multilayer structure, is the first main surface 101D of the mounting substrate 100D and a second surface, among the two surfaces opposed to each other in the thickness direction of the multilayer structure, is the second main surface of the mounting substrate 100D. The wiring structure may be, for example, an interposer. The interposer may be an interposer using a silicon substrate or a substrate composed of multiple layers.

The first reception filter 3b, the second reception filter 4b, the first phase adjustment circuit 6d, and the second phase adjustment circuit 7b are mounted on the first main surface 101D (refer to FIG. 17). The switch IC 110 including the antenna switch 5 is further mounted on the first main surface 101D (refer to FIG. 17). The switch IC 110 includes the multiple amplifiers 11 (the first low noise amplifier 12 and the second low noise amplifier 13), as in the first and second embodiments.

The first phase adjustment circuit 6d and the antenna switch 5 are connected to each other with surface wiring, such as a conductor pattern. Specifically, the first phase adjustment circuit 6d is connected to the antenna switch 5 with a path R411 formed of the surface wiring (refer to FIG. 17).

The first phase adjustment circuit 6d and the first reception filter 3b are connected to each other with surface wiring, such as a conductor pattern. Specifically, the first phase adjustment circuit 6d is connected to the first reception filter 3b with a path R412 formed of the surface wiring (refer to FIG. 17).

Part of the first phase adjustment circuit 6d may be mounted on the first main surface 101D of the mounting substrate 100D and the remaining portion of the first phase adjustment circuit 6d may be mounted in the mounting substrate 100D. In other words, the first phase adjustment circuit 6d is disposed at the first main surface 101D side with respect to the second main surface of the mounting substrate 100D and at least includes the portion mounted on the first main surface 101D. For example, the third reactance element (the inductor L63) may be mounted on the first main surface 101D and the first reactance element 61d (the capacitor C61) and the second reactance element (the capacitor C62) may be mounted in the mounting substrate 100D. In this case, the third reactance element 63d, the first reactance element 61d, and the second reactance element 62d are connected with each other with a path formed of an inner wiring conductor that is composed of a wiring conductor and a via conductor, which are provided in the mounting substrate 100D.

Part of the switch IC 110 may be mounted on the first main surface 101D of the mounting substrate 100D and the remaining portion of the switch IC 110 may be mounted in the mounting substrate 100D. In other words, the switch IC 110 is disposed at the first main surface 101D side with respect to the second main surface of the mounting substrate 100D and at least includes the portion mounted on the first main surface 101D.

The respective components provided on the first main surface 101D are electrically connected to the mounting substrate 100D with, for example, solder bumps. The solder bumps are disposed between the components that are disposed and the mounting substrate 100D in the thickness direction (the first direction D1) of the mounting substrate 100D. The first reception path R11 described above includes the paths R411 and R412 described above.

The radio-frequency module 1D further includes the resin layer on the first main surface 101D of the mounting substrate 100D, as in the second embodiment. Electronic components including the first reception filter 3b, the second reception filter 4b, the first phase adjustment circuit 6d, the second phase adjustment circuit 7b, and the switch IC 110, which are mounted on the first main surface 101D, are covered with the first resin layer. The resin layer is omitted in FIG. 17.

The first reactance element 61d, the third reactance element 63d, and the second reactance element 62d in the first phase adjustment circuit 6d and the first reception filter 3b are disposed in this order along the direction (corresponding to the second direction D2) orthogonal to the thickness direction. The first phase adjustment circuit 6d is connected to the antenna switch 5 via the path R411 included in the first reception path R11 (refer to FIG. 17).

Here, the path length between the antenna switch 5 and the first phase adjustment circuit 6d on the first reception path R11 is denoted by "AA3". Specifically, on the first reception path R11, the length from the selection terminal 521 of the antenna switch 5 to a node T11 of the first reactance element 61d, for example, the length of the path R411 (refer to FIG. 17) is denoted by "AA3" (refer to FIG. 16).

The path length between the first phase adjustment circuit 6d and the first reception filter 3b is denoted by "AA4". Specifically, on the first reception path R11, the length from a node T12 of the second reactance element 62d to an input terminal of the first reception filter 3b, for example, the length of the path R412 (refer to FIG. 17) is denoted by "AA4" (refer to FIG. 16).

Here, the total length of the second path length "AA2" of the path R311 and the first path length "AA1" of the path R312 is longer than the total length of the distance between the antenna switch 5 and the first reactance element 61d and the distance between the second reactance element 62d and the first reception filter 3b, on the first reception path R11. More specifically, the total length of the second path length "AA2" of the path R311 and the first path length "AA1" of the path R312 is longer than the total length of the distance (the path length "AA3") between the antenna switch 5 and the node T11 and the distance (the path length "AA4") between the node T12 and the first reception filter 3b, on the first reception path R11.

(3.3) Third Modification

In the second embodiment, the phase adjustment circuit 7b is disposed so that the inequality "AA1>AA2" is established for the first path length "AA1" and the second path length "AA2". However, the phase adjustment circuit 7b is not limited to this configuration.

The condition of the path widths of the path R311 and the path R312 may be added to the above condition (the inequality "AA1>AA2"). The paths R311 and R312 may be formed so that an inequality "BB1>BB2" is established where the path width of the path R311 is denoted by "BB1" and the path width of the path R312 is denoted by "BB2. The path width may be the average of the widths of the path, the maximum value thereof, or an intermediate value between the maximum value and the minimum value thereof.

Also in this case, it is possible to achieve more excellent impedance characteristics.

(3.4) Fourth Modification

Although the first reception filter 3b is configured to be a SAW filter in the second embodiment, the first reception filter 3b is not limited to this configuration. The first reception filter 3b may be another acoustic-wave filter, for example, an acoustic-wave filter using the boundary acoustic waves, the plate waves, or the likes. The first reception filter 3b may be, for example, a BAW filter.

The second reception filter 4b may be another acoustic-wave filter, for example, an acoustic-wave filter using the boundary acoustic waves, the plate waves, or the likes, like the first reception filter 3b. The second reception filter 4b may be, for example, a BAW filter.

(3.5) Fifth Modification

Although the mounting substrate 100B is configured to be a printed wiring board, an LTCC substrate, an HTCC substrate, or a resin substrate in the second embodiment, the mounting substrate 100B is not limited to this configuration. The mounting substrate 100B may be a component-embedded substrate.

(3.6) Sixth Modification

Although the antenna switch 5 and the multiple amplifiers 11 (the first low noise amplifier 12 and the second low noise amplifier 13) are configured to be included in the switch IC 110, that is, are configured to be formed into one chip in the second embodiment, the antenna switch 5 and the multiple amplifiers 11 are not limited to this configuration.

The antenna switch 5 and the multiple amplifiers 11 are not necessarily formed into one chip. The antenna switch 5 and the multiple amplifiers 11 may be separately disposed on the second main surface 102B.

(3.7) Seventh Modification

In the second embodiment, the radio-frequency module 1B may include a transmission filter, which is an acoustic-wave filter used for transmission of signals, instead of the first reception filter 3b. In this case, a power amplifier is used, instead of the first low noise amplifier 12.

The radio-frequency module 1B may include a duplexer (acoustic-wave filter) used for transmission and reception of signals, instead of the first reception filter 3b. In this case, the first low noise amplifier 12 and the power amplifier are connected to the duplexer.

In addition, the radio-frequency module 1B may include a duplexer (acoustic-wave filter) used for transmission and reception of signals, instead of the second reception filter 4b. In this case, the second low noise amplifier 13 and the power amplifier are connected to the duplexer.

The seventh modification may be applied to the first to sixth modifications of the second embodiment.

SUMMARY

As described above, a radio-frequency module (1; LA) of a first aspect includes a first acoustic-wave filter (for example, a first reception filter 3), a second acoustic-wave filter (for example, a second reception filter 4), an antenna (an antenna switch 5), a first inductor (L21), and a second inductor (L22). The first acoustic-wave filter transmits a signal in a first communication band. The second acoustic-wave filter transmits a signal in a second communication band. The switch is capable of simultaneously connecting the first acoustic-wave filter and the second acoustic-wave filter to an antenna terminal. The first inductor (L21) is provided between ground and a node on a signal path (for example, a second reception path R2) with which the switch is connected to the second acoustic-wave filter. The second inductor (L22) is connected in series between the switch and the first inductor (L21) on the signal path.

With the above configuration, performing the impedance matching using the first inductor (L21) and the second inductor (L22) keeps the impedance of the second acoustic-wave filter for the second communication band in the matching state and makes the impedance of the second acoustic-wave filter for the first communication band open. Consequently, it is possible to achieve more excellent impedance characteristics in, for example, the communication in which the first communication band and the second communication band are simultaneously used.

In the radio-frequency module (1; LA) of a second aspect, in the first aspect, a path length (a path length "A1"; "A11") between the switch and the second inductor on the signal path is longer than a path length (a path length "A2"; "A12") between the first inductor (L21) and the second inductor (L22) on the signal path.

With the above configuration, the amount of shift from the open end of the impedance of the second acoustic-wave filter in the first communication band is decreased even if the parasitic capacitance occurs. As a result, it is possible to achieve more excellent impedance characteristics in the communication in which the first communication band and the second communication band are simultaneously used.

In the radio-frequency module (1; LA) of a third aspect, in the first or second aspect, a path length (a path length "A1"; "A11") between the switch and the second inductor (L22) on the signal path is longer than a path length (a path length "A3"; "A13") between the first inductor (L21) and the second acoustic-wave filter on the signal path.

With the above configuration, the amount of shift from the open end of the impedance of the second acoustic-wave filter in the first communication band is decreased even if the parasitic inductor occurs. As a result, it is possible to achieve more excellent impedance characteristics in the communication in which the first communication band and the second communication band are simultaneously used.

In the radio-frequency module (1; LA) of a fourth aspect, in any of the first to third aspects, a path width between the switch and the second inductor (L22) on the signal path is greater than a path width between the first inductor (L21) and the second inductor (L22) on the signal path.

With the above configuration, the amount of shift from the open end of the impedance of the second acoustic-wave filter in the first communication band is decreased even if the parasitic capacitance occurs. As a result, it is possible to achieve more excellent impedance characteristics in the communication in which the first communication band and the second communication band are simultaneously used.

In the radio-frequency module (1; LA) of a fifth aspect, in any of the first to fourth aspects, a path width between the switch and the second inductor (L22) on the signal path is greater than a path width between the first inductor (L21) and the second acoustic-wave filter on the signal path.

With the above configuration, the amount of shift from the open end of the impedance of the second acoustic-wave filter in the first communication band is decreased even if the parasitic inductor occurs. As a result, it is possible to achieve more excellent impedance characteristics in the communication in which the first communication band and the second communication band are simultaneously used.

In the radio-frequency module (1; 1A) of a sixth aspect, in any of the first to fifth aspects, a path (R22; R32) between the first inductor (L21) and the second inductor (L22) on the signal path is formed of surface wiring.

With the above configuration, it is possible to decrease the parasitic capacitance that occurs, compared with a case in which the path (R22; R32) between the first inductor (L21) and the second inductor (L22) is provided in the mounting substrate (100; 100A).

In the radio-frequency module (1; 1A) of a seventh aspect, in any of the first to sixth aspects, a path (R23; R33) between the first inductor (L21) and the second acoustic-wave filter on the signal path is formed of surface wiring.

With the above configuration, it is possible to decrease the parasitic inductor that occurs, compared with a case in which the path (R23; R33) between the first inductor (L21) and the second acoustic-wave filter is provided in the mounting substrate (100; 100A).

The radio-frequency module (1) of an eighth aspect further includes a mounting substrate (100) in any of the first to seventh aspects. The mounting substrate (100) has a first main surface (101) and a second main surface (102) that are opposed to each other in the thickness direction (for example, a first direction D1). The first acoustic-wave filter, the second acoustic-wave filter, the first inductor (L21), and the second inductor (L22) are disposed at the first main surface (101) side. The switch is disposed at the second main surface (102) side.

With the above configuration, it is possible to achieve more excellent impedance characteristics in the communication in which the first communication band and the second communication band are simultaneously used while mounting the components including the switch on both faces of the mounting substrate (100).

The radio-frequency module (1) of a ninth aspect further includes a plurality of external connection electrodes (90; 90B) disposed on the second main surface (102) in the eighth aspect.

With the above configuration, it is possible to achieve more excellent impedance characteristics in the communication in which the first communication band and the second communication band are simultaneously used while disposing the switch in the gap between a mother board or the like to which the external connection electrodes (90) are connected and the mounting substrate (100).

In the radio-frequency module (1) of a tenth aspect, in the eighth or ninth aspect, in a plan view of the mounting substrate (100), at least part of the second inductor (L22) is overlapped with the switch.

With the above configuration, it is possible to shorten the path length between the switch and the second inductor (L22).

In the radio-frequency module (1) of an eleventh aspect, in any of the eighth to tenth aspects, in a plan view of the mounting substrate (100), at least part of the first inductor (L21) is overlapped with the switch.

With the above configuration, it is possible to shorten the path length from the switch to the second inductor (L22) and the first inductor (L21).

The radio-frequency module (1) of a twelfth aspect further includes a first low noise amplifier (12) and a second low noise amplifier (13) in any of the eighth to eleventh aspects. The first low noise amplifier (12) is connected to the first acoustic-wave filter. The second low noise amplifier (13) is connected to the second acoustic-wave filter. The first low noise amplifier (12) and the second low noise amplifier (13) are provided on the second main surface (102). In a plan view of the mounting substrate (100), at least part of the first acoustic-wave filter is overlapped with the first low noise amplifier (12). At least part of the second acoustic-wave filter is overlapped with the second low noise amplifier (13).

With the above configuration, it is possible to shorten the path length between the first acoustic-wave filter and the first low noise amplifier (12) and the path length between the second acoustic-wave filter and the second low noise amplifier (13).

The radio-frequency module (1) of a thirteenth aspect further includes a first reactance element (61), a second reactance element (62), and a third reactance element (63) in any of the eighth to twelfth aspects. The first reactance element (61) is inserted in series on a first communication band signal path (for example, a first reception path R1) between the switch and the first acoustic-wave filter. The second reactance element (62) is provided between a first end of the first reactance element (61) and the ground on the first communication band signal path. The third reactance element (63) is provided between a second end of the first reactance element (61) and the ground on the first communication band signal path.

With the above configuration, it is possible to shift the impedance of the second acoustic-wave filter in the first communication band to the neighborhood of the open end when the first acoustic-wave filter side is viewed from the switch.

A radio-frequency module (1B; 1C; 1D) of a fourteenth aspect includes a first acoustic-wave filter (for example, a first reception filter 3b), a second acoustic-wave filter (for example, a second reception filter 4b), a switch (for example, an antenna switch 5), and a phase adjustment circuit (7b). The first acoustic-wave filter transmits a signal in a first communication band. The second acoustic-wave filter transmits a signal in a second communication band, which is a frequency band lower than a frequency band of the first communication band. The switch is capable of simultaneously connecting the first acoustic-wave filter and the second acoustic-wave filter to an antenna terminal (2). The phase adjustment circuit (7b) is provided on a signal path (for example, a second reception path R12) with which the switch is connected to the second acoustic-wave filter and adjusts a phase of the signal in the second communication band. The phase adjustment circuit (7b) includes an inductor (71b), a first capacitor (72b), and a second capacitor (73b). The inductor (71b) is connected in series between the switch and the second acoustic-wave filter on the signal path. The first capacitor (72b) is provided between a first end (T2) at the switch side, among both ends of the inductor (71b), and ground on the signal path. The second capacitor (73b) is provided between a second end (T1) at the second acoustic-wave filter side, among both ends of the inductor (71b), and the ground on the signal path. A length (a first path length "AA1") of a first path (for example, a path R312) between a node (the second end T1 of the inductor 71b) between the inductor (71b) and the second capacitor (73b) and the second acoustic-wave filter on the signal path is longer than a length (a second path length "AA2") of a second path (for example, a path R311) between a node (the first end T2 of the inductor 71b) between the inductor (71b) and the first capacitor (72b) and the switch on the signal path.

With the above configuration, it is possible to achieve more excellent impedance characteristics in the communication in which the first communication band and the second communication band are simultaneously used.

In the radio-frequency module (1B; 1C; 1D) of a fifteenth aspect, in the fourteenth aspect, a path width of the first path is greater than a path width of the second path.

With the above configuration, it is possible to achieve more excellent impedance characteristics.

In the radio-frequency module (1B; 1C; 1D) of a sixteenth aspect, in the fourteenth or fifteenth aspect, the first path and the second path are each formed of surface wiring.

With the above configuration, it is possible to decrease the parasitic capacitance that occurs, compared with a case in which the first path and the second path are provided in the mounting substrate (100B; 100C; 100D).

The radio-frequency module (1C) of a seventeenth aspect further includes a mounting substrate (100C) having a first main surface (101C) and a second main surface (102C) that are opposed to each other in any of the fourteenth to sixteenth aspects. The first acoustic-wave filter, the second acoustic-wave filter, the inductor (71b), the first capacitor (72b), and the second capacitor (73b) are disposed at the first main surface (101C) side. The switch is disposed at the second main surface (102C) side.

With the above configuration, it is possible to achieve more excellent impedance characteristics in the communication in which the first communication band and the second communication band are simultaneously used while mounting the components including the switch on both faces of the mounting substrate (100C).

The radio-frequency module (1C) of an eighteenth aspect further includes a plurality of external connection electrodes (90c) disposed on the second main surface (102C) in the seventeenth aspect.

With the above configuration, it is possible to achieve more excellent impedance characteristics in the communication in which the first communication band and the second communication band are simultaneously used while disposing the switch in the gap between a mother board or the like to which the external connection electrodes (90c) are connected and the mounting substrate (100C).

In the radio-frequency module (1C) of a nineteenth aspect, in the seventeenth or eighteenth aspect, in a plan view of the mounting substrate (100C), at least part of the first capacitor (72b) is overlapped with the switch.

With the above configuration, it is possible to shorten the length (the second path length "AA2") of the second path of the signal path (for example, the second reception path R12).

In the radio-frequency module (1C) of a twentieth aspect, in any of the seventeenth to nineteenth aspects, in a plan view of the mounting substrate (100C), at least part of the second capacitor (73b) is overlapped with the switch.

With the above configuration, it is possible to shorten the length (the second path length "AA2") of the second path of the reception path.

The radio-frequency module (1C) of a twenty-first aspect further includes a first low noise amplifier (12) and a second low noise amplifier (13) in any of the seventeenth to twentieth aspects. The first low noise amplifier (12) is connected to the first acoustic-wave filter. The second low noise amplifier is connected to the second acoustic-wave filter. The first low noise amplifier (12) and the second low noise amplifier (13) are provided on the second main surface (102C). In a plan view of the mounting substrate (100C), at least part of the first acoustic-wave filter is overlapped with the first low noise amplifier (12) and at least part of the second acoustic-wave filter is overlapped with the second low noise amplifier (13).

With the above configuration, it is possible to shorten the path length between the first acoustic-wave filter and the first low noise amplifier (12) and the path length between the second acoustic-wave filter and the second low noise amplifier (13).

The radio-frequency module (1D) of a twenty-second aspect further includes a second phase adjustment circuit (a first phase adjustment circuit 6d) that is different from a first phase adjustment circuit, which is the phase adjustment circuit (7b), in any of the fourteenth to twenty-first aspects. The second phase adjustment circuit is provided on a first communication band signal path (the first reception path R11) with which the switch is connected to the first acoustic-wave filter. The second phase adjustment circuit includes a first reactance element (61d), a second reactance element (62d), and a third reactance element (63d). The first reactance element (61d) and the second reactance element (62d) are inserted in series on the first communication band signal path between the switch and the first acoustic-wave filter. The third reactance element (63d) has one end connected between the first reactance element (61d) and the second reactance element (62d) and the other end that is grounded. The first reactance element (61d) is disposed between the switch and the second reactance element (62d) on the first communication band signal path. A total length of the length of the first path (the path R312) and the length of the second path (the path R311) is longer than a total length of a distance (the path length "AA3") between the switch and the first reactance element (61d) and a distance (the path length "AA4") between the second reactance element (62d) and the first acoustic-wave filter on the first communication band signal path.

With the above configuration, it is possible to achieve more excellent impedance characteristics in the communication in which the first communication band and the second communication band are simultaneously used.

A communication apparatus (8) of a twenty-third aspect includes the radio-frequency module (1; 1A; 1B; 1C; 1D) of any of the first to twenty-second aspects and a signal processing circuit (80). The signal processing circuit (80) performs signal processing of the signal in the first communication band and the signal in the second communication band.

With the above configuration, it is possible to achieve more excellent impedance characteristics in the communication in which the first communication band and the second communication band are simultaneously used.

REFERENCE SIGNS LIST 1, 1A, 1B, 1C, 1D radio-frequency module
2 antenna terminal
3, 3b first reception filter (first acoustic-wave filter)
4, 4b second reception filter (second acoustic-wave filter)
5 antenna switch (switch)
6, 6d first phase adjustment circuit
7 second phase adjustment circuit
7b phase adjustment circuit (second phase adjustment circuit)
8 communication apparatus
9 antenna
11 amplifier
12 first low noise amplifier
13 second low noise amplifier
51 common terminal
61, 61d first reactance element
62, 62d second reactance element
63, 63d third reactance element
71b inductor
72b first capacitor
73b second capacitor
80 signal processing circuit
81 baseband signal processing circuit
82 RF signal processing circuit
90, 90A, 90B, 90b, 90c, 91c external connection electrode
95, 96, 97 via conductor
98 wiring conductor
100, 100A, 100B, 100C, 100D mounting substrate
101, 101A, 101B, 101C, 101D first main surface
102, 102A, 102B, 102C second main surface
110 switch IC
120 first resin layer (resin layer)
130 second resin layer
521, 522 selection terminal
C11, C12, C61, C62 capacitor
D1 first direction
D2 second direction
L11, L63 inductor
L21 first inductor
L22 second inductor
R1, R11 first reception path
R2, R12 second reception path
R21, R22, R23, R25, R31, R32, R33, R311, R312, R411, R412 path
T1 second end (node)
T2 first end (node)
T11, T12 node

The invention claimed is:

1. A radio-frequency module comprising:
a first acoustic-wave filter configured to transmit a signal in a first communication band;
a second acoustic-wave filter configured to transmit a signal in a second communication band;
a switch configured to simultaneously connect the first acoustic-wave filter and the second acoustic-wave filter to an antenna terminal;
a first inductor connected between ground and a node on a signal path, the signal path connecting the switch to the second acoustic-wave filter; and
a second inductor having a first end connected to the switch and a second end connected to the first inductor in the signal path,
wherein a path length between the switch and the second inductor in the signal path is longer than a path length between the first inductor and the second inductor in the signal path towards the second acoustic wave filter.

2. The radio-frequency module according to claim 1, wherein the path length between the switch and the second inductor in the signal path is longer than a path length between the first inductor and the second acoustic-wave filter in the signal path.

3. The radio-frequency module according to claim 1, wherein a path width between the switch and the second inductor in the signal path is greater than a path width between the first inductor and the second inductor in the signal path.

4. The radio-frequency module according to claim 1, wherein a path width between the switch and the second inductor in the signal path is greater than a path width between the first inductor and the second acoustic-wave filter in the signal path.

5. The radio-frequency module according to claim 1, wherein a path between the first inductor and the second inductor in the signal path comprises surface wiring.

6. The radio-frequency module according to claim 1, wherein a path between the first inductor and the second acoustic-wave filter in the signal path comprises surface wiring.

7. The radio-frequency module according to claim 1, further comprising:
a mounting substrate having a first main surface and a second main surface that are opposed to each other,
wherein the first acoustic-wave filter, the second acoustic-wave filter, the first inductor, and the second inductor are physically arranged on the first main surface, and
wherein the switch is physically arranged on the second main surface.

8. The radio-frequency module according to claim 7, further comprising:
a plurality of external connection electrodes physically arranged on the second main surface.

9. The radio-frequency module according to claim 7, wherein, in a plan view of the mounting substrate, at least part of the first inductor or the second inductor overlaps the switch.

10. The radio-frequency module according to claim 7, further comprising:
a first low noise amplifier connected to the first acoustic-wave filter; and
a second low noise amplifier connected to the second acoustic-wave filter,
wherein the first low noise amplifier and the second low noise amplifier are physically arranged on the second main surface, and
wherein, in a plan view of the mounting substrate, at least part of the first acoustic-wave filter overlaps the first low noise amplifier, and at least part of the second acoustic-wave filter overlaps the second low noise amplifier.

11. The radio-frequency module according to claim 7, further comprising:
a first reactance element connected in series in a first communication band signal path between the switch and the first acoustic-wave filter;
a second reactance element connected between a first end of the first reactance element and ground in the first communication band signal path; and
a third reactance element connected between a second end of the first reactance element and ground in the first communication band signal path.

12. A radio-frequency module comprising:
a first acoustic-wave filter configured to transmit a signal in a first communication band;
a second acoustic-wave filter configured to transmit a signal in a second communication band, the second communication band being a lower frequency band than a frequency band of the first communication band;
a switch configured to simultaneously connect the first acoustic-wave filter and the second acoustic-wave filter to an antenna terminal; and
a phase adjustment circuit connected in a signal path and configured to adjust a phase of the signal in the second communication band, the signal path connecting the switch to the second acoustic-wave filter,
wherein the phase adjustment circuit comprises:
an inductor that is connected in series between the switch and the second acoustic-wave filter in the signal path;
a first capacitor that is connected between a switch side of the inductor and ground in the signal path; and
a second capacitor that is connected between a second acoustic-wave filter side of the inductor and ground in the signal path, and
wherein a first path connects a node between the inductor and the second capacitor to the second acoustic-wave filter in the signal path is longer than a second path that connects a node between the inductor and the first capacitor to the switch in the signal path.

13. The radio-frequency module according to claim 12, wherein a path width of the first path is greater than a path width of the second path.

14. The radio-frequency module according to claim 12, wherein the first path and the second path each comprise surface wiring.

15. The radio-frequency module according to claim 12, further comprising:
a mounting substrate having a first main surface and a second main surface that are opposed to each other,
wherein the first acoustic-wave filter, the second acoustic-wave filter, the inductor, the first capacitor, and the second capacitor are physically arranged on the first main surface, and
wherein the switch is physically arranged on the second main surface.

16. The radio-frequency module according to claim 15, further comprising:
a plurality of external connection electrodes physically arranged on the second main surface.

17. The radio-frequency module according to claim 15, wherein, in a plan view of the mounting substrate, at least part of the first capacitor or the second capacitor overlaps the switch.

18. The radio-frequency module according to claim 15, further comprising:
a first low noise amplifier connected to the first acoustic-wave filter; and
a second low noise amplifier connected to the second acoustic-wave filter,
wherein the first low noise amplifier and the second low noise amplifier are physically arranged on the second main surface, and
wherein, in a plan view of the mounting substrate, at least part of the first acoustic-wave filter overlaps the first low noise amplifier, and at least part of the second acoustic-wave filter overlaps the second low noise amplifier.

19. The radio-frequency module according to claim 12, further comprising:
a second phase adjustment circuit that is different from the phase adjustment circuit,
wherein the second phase adjustment circuit is connected in a first communication band signal path in which the switch is connected to the first acoustic-wave filter,
wherein the second phase adjustment circuit comprises:
a first reactance element and a second reactance element connected in series in the first communication band signal path between the switch and the first acoustic-wave filter; and
a third reactance element that has a first end connected between the first reactance element and the second reactance element, and a second end that is grounded,
wherein the first reactance element is connected between the switch and the second reactance element in the first communication band signal path, and
wherein a total length of the first path and the second path is longer than a total length of a distance between the switch and the first reactance element and a distance between the second reactance element and the first acoustic-wave filter in the first communication band signal path.

* * * * *

UNITED STATES PATENT AND TRADEMARK OFFICE
CERTIFICATE OF CORRECTION

PATENT NO. : 12,368,466 B2
APPLICATION NO. : 17/805235
DATED : July 22, 2025
INVENTOR(S) : Kouichi Ueno et al.

Page 1 of 1

It is certified that error appears in the above-identified patent and that said Letters Patent is hereby corrected as shown below:

In the Specification

Column 32, Line 59, "module (1; LA) of" should be --module (1; 1A) of--

Column 33, Line 18, "module (1; LA) of" should be --module (1; 1A) of--

Column 33, Line 31, "module (1; LA) of" should be --module (1; 1A) of--

Column 33, Line 44, "module (1; LA) of" should be --module (1; 1A) of--

Column 33, Line 56, "module (1; LA) of" should be --module (1; 1A) of--

Signed and Sealed this
Sixteenth Day of September, 2025

Coke Morgan Stewart
*Acting Director of the United States Patent and Trademark Office*